(12) United States Patent
Wang et al.

(10) Patent No.: US 11,276,647 B2
(45) Date of Patent: Mar. 15, 2022

(54) METHOD OF FORMING SEMICONDUCTOR DEVICE

(71) Applicant: Taiwan Semiconductor Manufacturing Company, Ltd., Hsinchu (TW)

(72) Inventors: Jhih-Yu Wang, New Taipei (TW); Yung-Chi Chu, Kaohsiung (TW); Sih-Hao Liao, New Taipei (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

(21) Appl. No.: 16/834,103

(22) Filed: Mar. 30, 2020

(65) Prior Publication Data

US 2020/0227357 A1    Jul. 16, 2020

Related U.S. Application Data

(63) Continuation of application No. 15/966,512, filed on Apr. 30, 2018, now Pat. No. 10,607,941.

(51) Int. Cl.
*H01L 23/544* (2006.01)
*H01L 25/10* (2006.01)
(Continued)

(52) U.S. Cl.
CPC ........ *H01L 23/544* (2013.01); *H01L 21/4853* (2013.01); *H01L 21/4857* (2013.01); *H01L 21/565* (2013.01); *H01L 21/568* (2013.01); *H01L 21/78* (2013.01); *H01L 23/3114* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01);
(Continued)

(58) Field of Classification Search
CPC .......... H01L 2224/023–024; H01L 2223/5446
See application file for complete search history.

(56) References Cited

U.S. PATENT DOCUMENTS 7,858,010 B2    12/2010   Cho et al.
9,947,626 B2     4/2018   Chen et al.
(Continued)

FOREIGN PATENT DOCUMENTS

CN    11010201538 A    6/2008
CN       104007611 A    8/2014
(Continued)

*Primary Examiner* — Moazzam Hossain
*Assistant Examiner* — Stanetta D Isaac
(74) *Attorney, Agent, or Firm* — Slater Matsil, LLP

(57) ABSTRACT

A method includes encapsulating a device die in an encapsulating material, forming a first dielectric layer over the device die and the encapsulating material, forming first redistribution lines extending into the first dielectric layer to electrically couple to the device die, forming an alignment mark over the first dielectric layer, wherein the alignment mark includes a plurality of elongated strips, forming a second dielectric layer over the first redistribution lines and the alignment mark, and forming second redistribution lines extending into the second dielectric layer to electrically couple to the first redistribution lines. The second redistribution lines are formed using the alignment mark for alignment.

20 Claims, 30 Drawing Sheets

(51) Int. Cl.
    *H01L 23/00*     (2006.01)
    *H01L 23/31*     (2006.01)
    *H01L 23/538*     (2006.01)
    *H01L 21/48*     (2006.01)
    *H01L 21/56*     (2006.01)
    *H01L 21/78*     (2006.01)
    *H01L 25/00*     (2006.01)

(52) U.S. Cl.
    CPC ............ *H01L 25/105* (2013.01); *H01L 25/50* (2013.01); *H01L 2223/54426* (2013.01); *H01L 2224/214* (2013.01); *H01L 2225/1035* (2013.01); *H01L 2225/1058* (2013.01); *H01L 2225/1082* (2013.01)

(56) References Cited

U.S. PATENT DOCUMENTS

| | | |
|---|---|---|
| 2009/0075457 A1 | 3/2009 | Machida |
| 2011/0018118 A1 | 1/2011 | Hsieh et al. |
| 2014/0048953 A1 | 2/2014 | Pratt et al. |
| 2015/0221714 A1 | 8/2015 | Gu et al. |
| 2016/0093574 A1 | 3/2016 | Cai et al. |
| 2017/0271283 A1 | 9/2017 | Lee et al. |
| 2017/0278802 A1 | 9/2017 | Chen et al. |

FOREIGN PATENT DOCUMENTS

| | | |
|---|---|---|
| KR | 20050066889 A | 6/2005 |
| KR | 20160111308 A | 9/2016 |

METHOD OF FORMING SEMICONDUCTOR DEVICE

PRIORITY CLAIM AND CROSS-REFERENCE

This application is a continuation of U.S. patent application Ser. No. 15/966,512, entitled "Method of Forming Semiconductor Device," filed on Apr. 30, 2018, which application is incorporated herein by reference

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29A-1 and 29A-2 illustrate an alignment mark and corresponding brightness-contrast signal intensity, respectively in accordance with some embodiments.

FIGS. 29B-1 and 29B-2 illustrate an alignment mark and the corresponding brightness-contrast signal intensity, respectively in accordance with some embodiments.

FIGS. 29C-1 and 29C-2 illustrate an alignment mark with inversed pattern and the corresponding brightness-contrast signal intensity, respectively in accordance with some embodiments.

DETAILED DESCRIPTION

Figure 1:
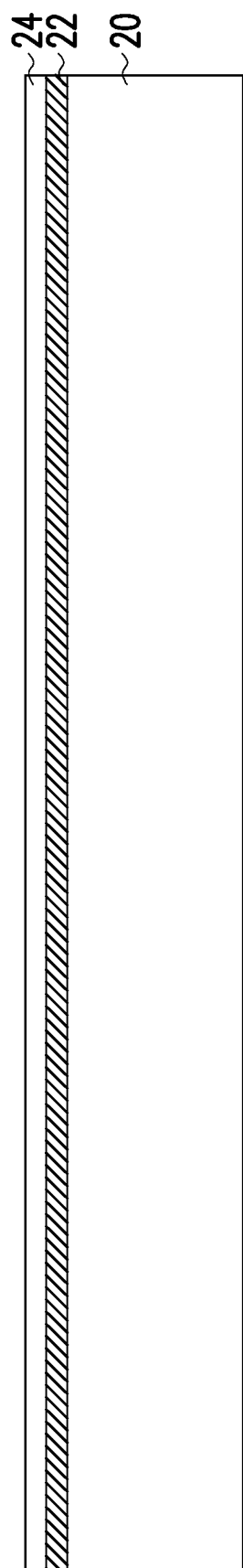
FIGS. 1 through 18 illustrate intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package including alignment marks having grating patterns and the method of forming the same are provided in accordance with various embodiments. The intermediate stages of forming the InFO package are illustrated in accordance with some embodiments. Some variations of some embodiments are discussed. Throughout the various views and illustrative embodiments, like reference numbers are used to designate like elements.

Figure 30:
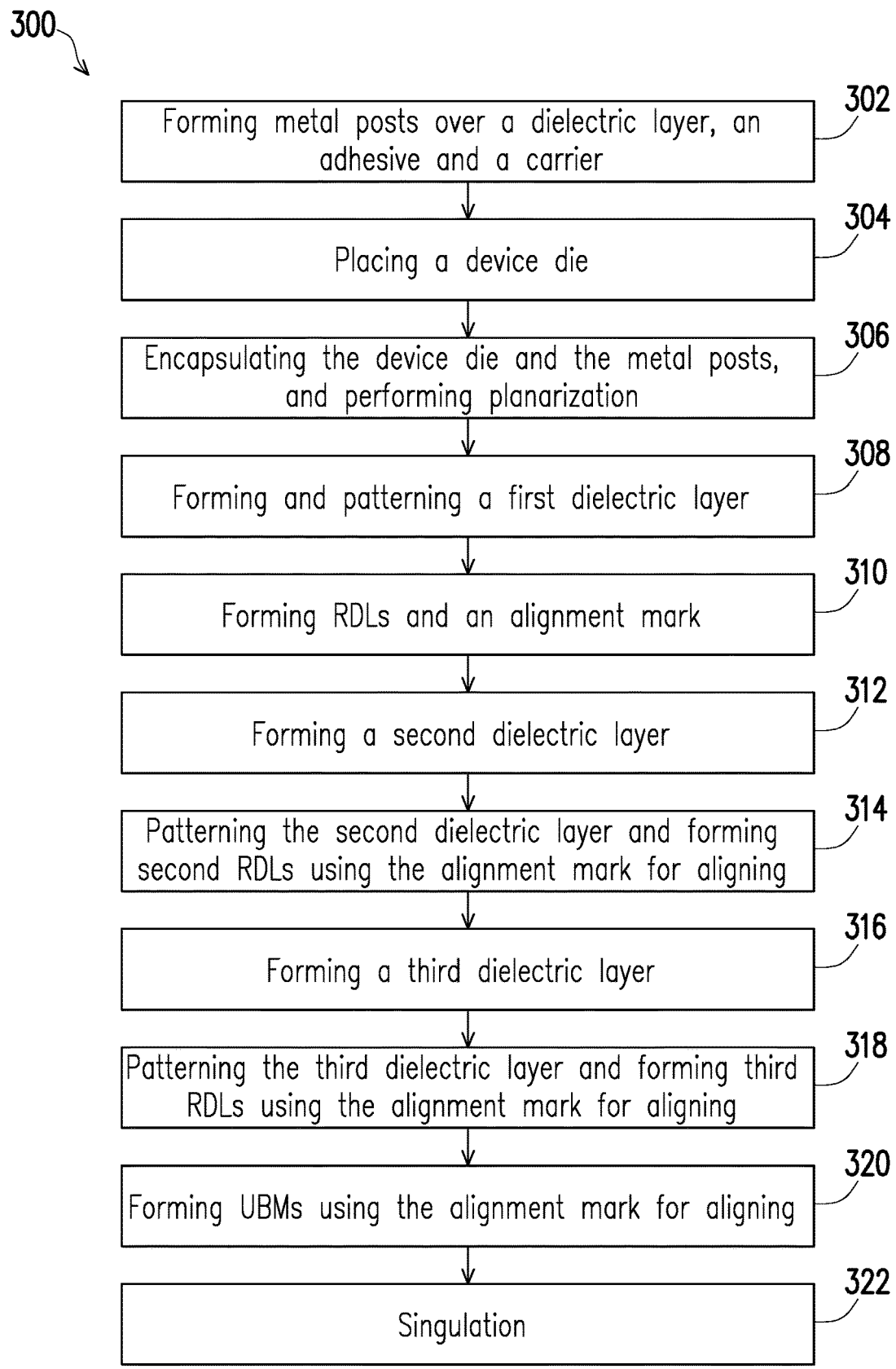
FIG. 30 illustrates a process flow for forming a package in accordance with some embodiments.

FIGS. 1 through 18 illustrate the cross-sectional views of intermediate stages in the formation of a package in accordance with some embodiments. The steps shown in FIG. 1 through 18 are also illustrated schematically in the process flow 300 shown in FIG. 30.

Referring to FIG. 1, carrier 20 is provided, and release film 22 is coated on carrier 20. Carrier 20 is formed of a transparent material, and may be a glass carrier, a ceramic carrier, an organic carrier, or the like. Carrier 20 may have a round top-view shape, and may have a size of a silicon wafer. Release film 22 is in physical contact with the top surface of carrier 20. Release film 22 may be formed of a Light-To-Heat-Conversion (LTHC) coating material.

Release film 22 may be applied onto carrier 20 through coating. In accordance with some embodiments of the present disclosure, the LTHC coating material is capable of being decomposed under the heat of light/radiation (such as a laser beam), and hence can release carrier 20 from the structure formed thereon.

In accordance with some embodiments, as also shown in FIG. 1, polymer buffer layer 24 is formed on LTHC coating material 22. Polymer buffer layer 24 may be formed of polybenzoxazole (PBO), polyimide, benzocyclobutene (BCB), or another applicable polymer.

Figure 2:
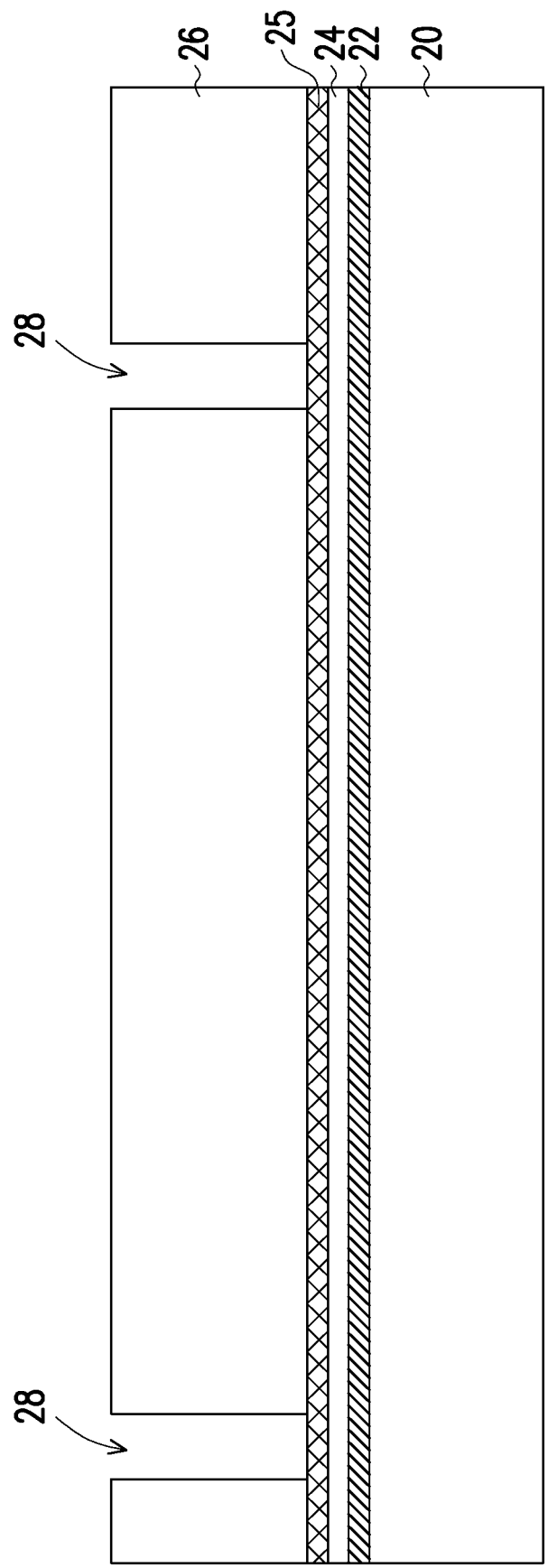
Figure 3:
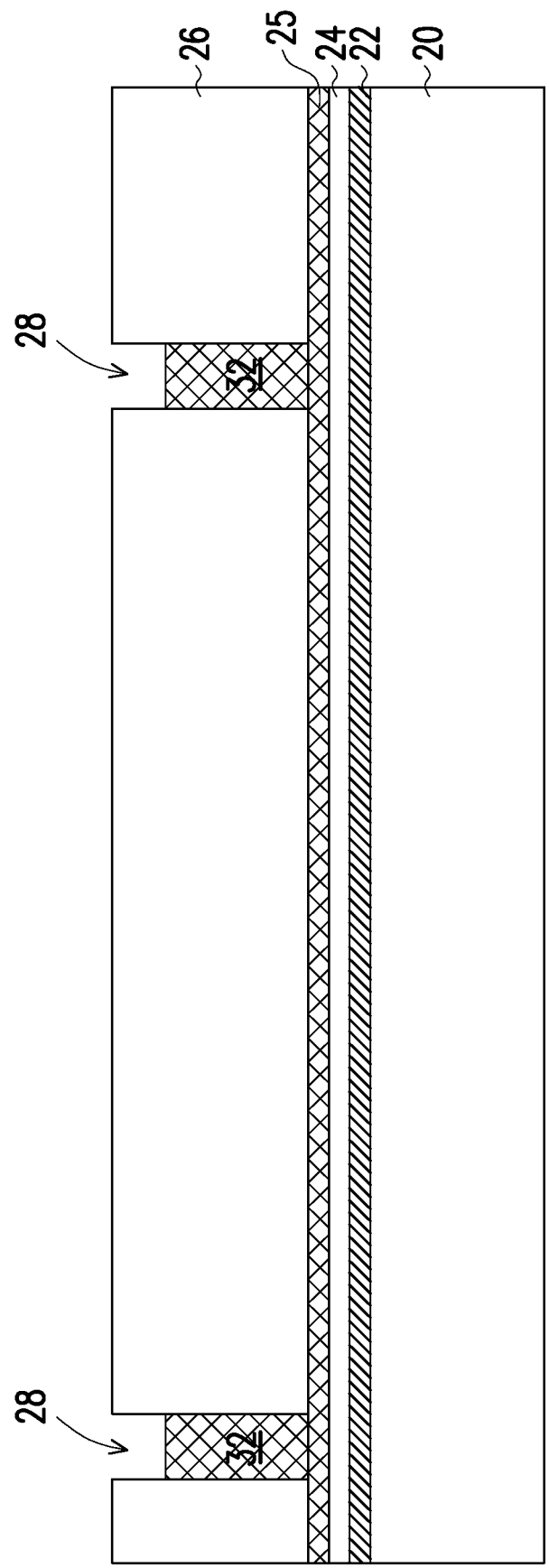
Figure 4:
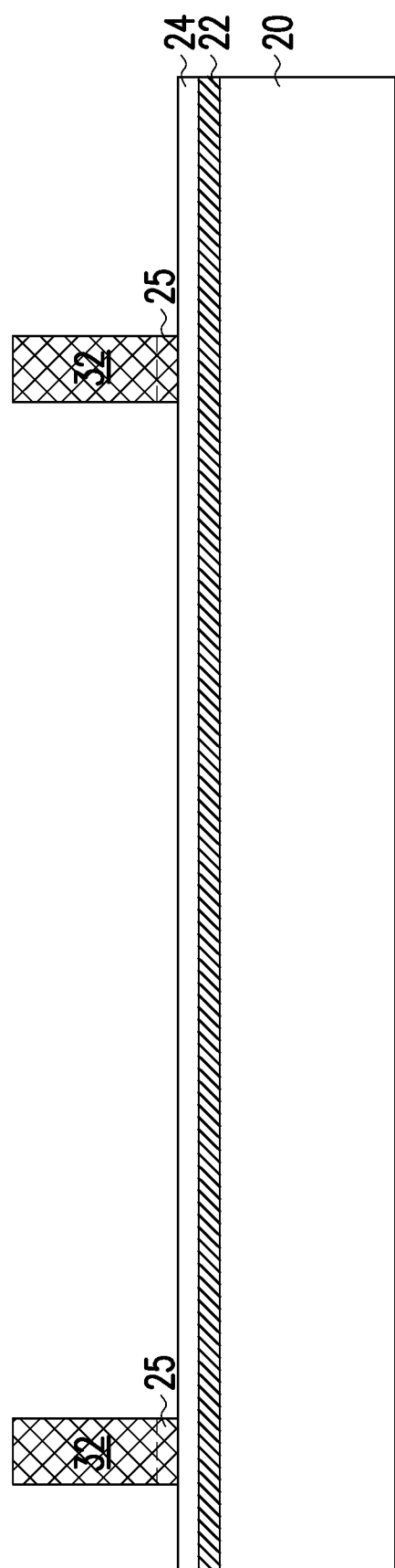

FIGS. 2 through 4 illustrate the formation of metal posts 32. The respective process is illustrated as process 302 in the process flow shown in FIG. 30. Throughout the description, metal posts 32 are alternatively referred to as through-vias 32 since metal posts 32 penetrate through the subsequently dispensed encapsulating material.

Referring to FIG. 2, metal seed layer 25 is formed, for example, through Physical Vapor Deposition (PVD). Metal seed layer 25 may be in physical contact with polymer buffer layer 24. In accordance with some embodiments of the present disclosure, metal seed layer 25 includes a titanium layer and a copper layer over the titanium layer. In accordance with alternative embodiments of the present disclosure, metal seed layer 25 includes a copper layer contacting buffer dielectric layer 24.

As also shown in FIG. 2, photo resist 26 is formed over metal seed layer 25. A light-exposure is then performed on photo resist 26 using a photo lithography mask (not shown). After a subsequent development, openings 28 are formed in photo resist 26. Some portions of metal seed layer 25 are exposed through openings 28.

Next, as shown in FIG. 3, metal posts 32 are formed by plating a metallic material in openings 28. The plated metallic material may be copper or a copper alloy. The top surfaces of metal posts 32 are lower than the top surface of photo resist 26, so that metal posts 32 are confined by openings 28. Metal posts 32 may have substantially vertical and straight edges. Alternatively, metal posts 32 may have a sand-timer shape in a cross-sectional view, with the middle parts of metal posts 32 being narrower than the respective top parts and bottom parts.

In subsequent steps, photo resist 26 is removed, and the underlying portions of metal seed layer 25 are exposed. The exposed portions of metal seed layer 25 are then removed in an etching step, for example, in a plurality of anisotropic and/or isotropic etching steps. The edges of the remaining seed layer 25 are thus substantially co-terminus with the respective overlying portions of metal posts 32. The resulting metal posts 32 are illustrated in FIG. 4. Throughout the description, the remaining portions of metal seed layer 25 are considered as parts of metal posts 32, and are not illustrated separately. The top-view shapes of metal posts 32 include, and are not limited to, circular shapes, rectangles, hexagons, octagons, and the like. After the formation of metal posts 32, polymer buffer layer 24 is exposed.

Figure 5:
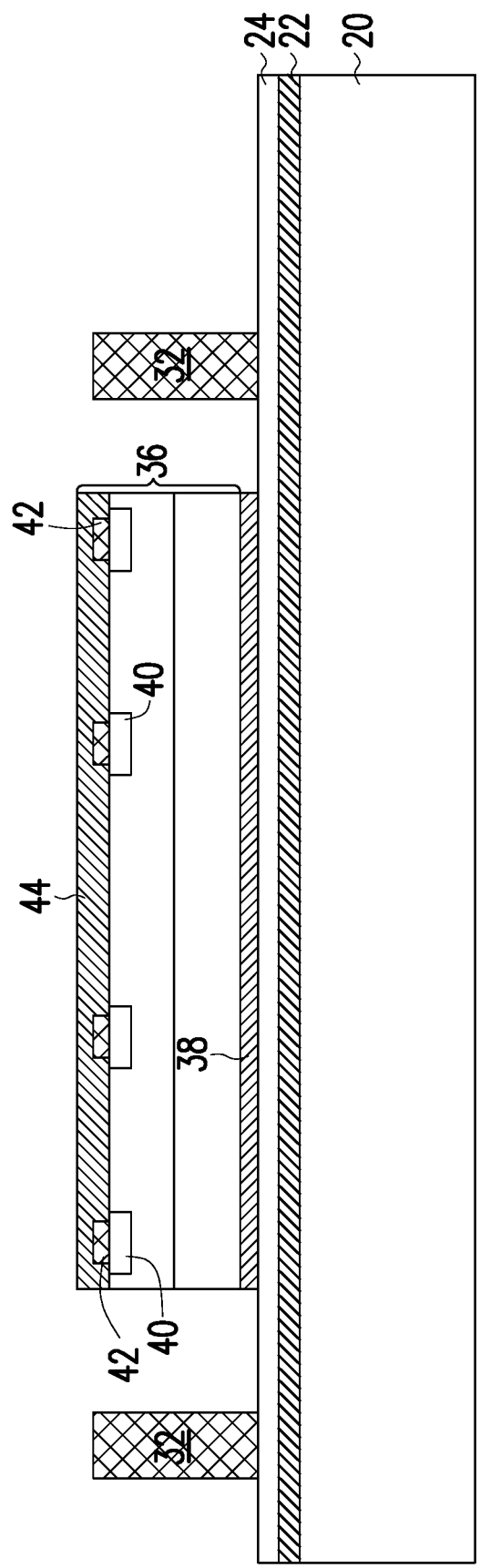

FIG. 5 illustrates the placement/attachment of device die 36. The respective process is illustrated as process 304 in the process flow shown in FIG. 30. Device die 36 is attached to polymer buffer layer 24 through Die-Attach Film (DAF) 38, which is an adhesive film. DAF 38 may be pre-attached on device die 36 before device die 36 is placed on polymer buffer layer 24. Accordingly, DAF 38 and device die 36, before attached to polymer buffer layer 24, are in combination an integrated piece. Device die 36 may include a semiconductor substrate having a back surface (the surface facing down) in physical contact with DAF 38. Device die 36 may include integrated circuit devices (such as active devices, which include transistors, for example, not shown) at the front surface (the surface facing up) of the semiconductor substrate. In accordance with some embodiments of the present disclosure, device die 36 is a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is at wafer level, although one device die 36 is illustrated, a plurality of identical device dies 36 is placed over polymer buffer layer 24, and may be allocated as an array including a plurality of rows and a plurality of columns.

In accordance with some embodiments, metal pillars 42 (such as copper pillars) are pre-formed as portions of device die 36, and metal pillars 42 are electrically coupled to the integrated circuit devices such as transistors (not shown) in device die 36. In accordance with some embodiments of the present disclosure, a dielectric material such as a polymer fills the gaps between neighboring metal pillars 42 to form top dielectric layer 44. Top dielectric layer 44 may also include a portion covering and protecting metal pillars 42. Polymer layer 44 may be formed of PBO or polyimide in accordance with some embodiments of the present disclosure.

Figure 6:
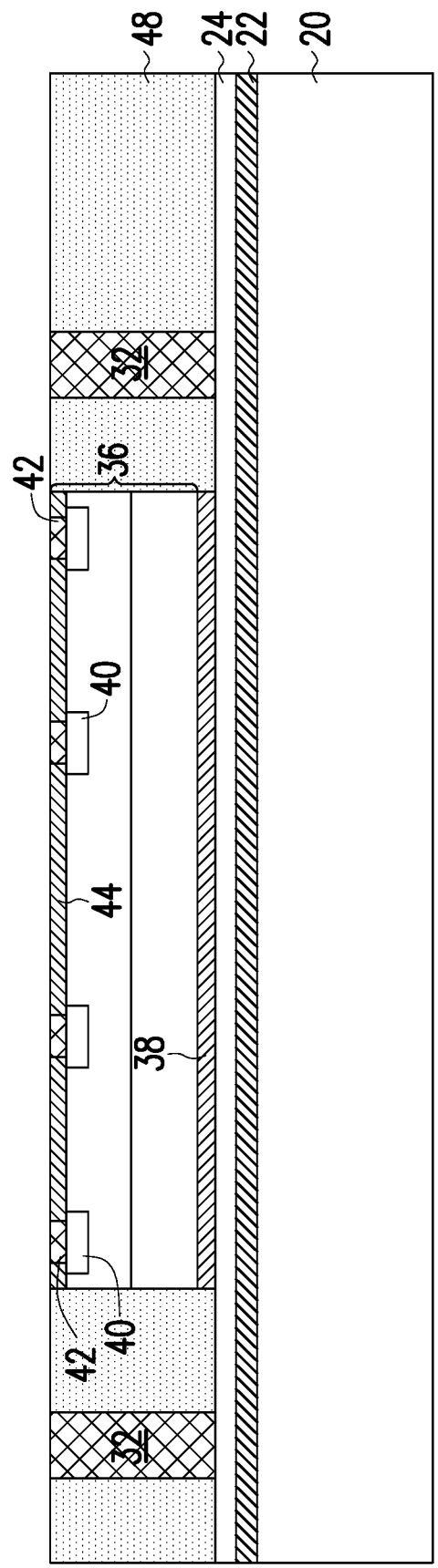

Next, device die 36 and metal posts 32 are encapsulated in encapsulating material 48, as shown in FIG. 6. The respective process is illustrated as process 306 in the process flow shown in FIG. 30. Encapsulating material 48 fills the gaps between neighboring metal posts 32 and the gaps between metal posts 32 and device die 36. Encapsulating material 48 may include a molding compound, a molding underfill, an epoxy, and/or a resin. The top surface of encapsulating material 48 is higher than the top ends of metal pillars 42. When formed of molding compound, encapsulating material 48 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters. Both the filler particles and the base material in encapsulating material 48 may be in physical contact with polymer buffer layer 24.

In a subsequent step, a planarization process such as a Chemical Mechanical Polish (CMP) process or a mechanical grinding process is performed to thin encapsulating material 48 and dielectric layer 44, until metal posts 32 and metal pillars 42 are all exposed. The respective process is also illustrated as process 306 in the process flow shown in FIG. 30. Due to the planarization process, the top ends of metal posts 32 are substantially level (coplanar) with the top surfaces of metal pillars 42, and are substantially coplanar with the top surface of encapsulating material 48. Metal posts 32 are alternatively referred to as through-vias 32 in subsequent paragraphs since they penetrate through encapsulating material 48.

Figure 7:
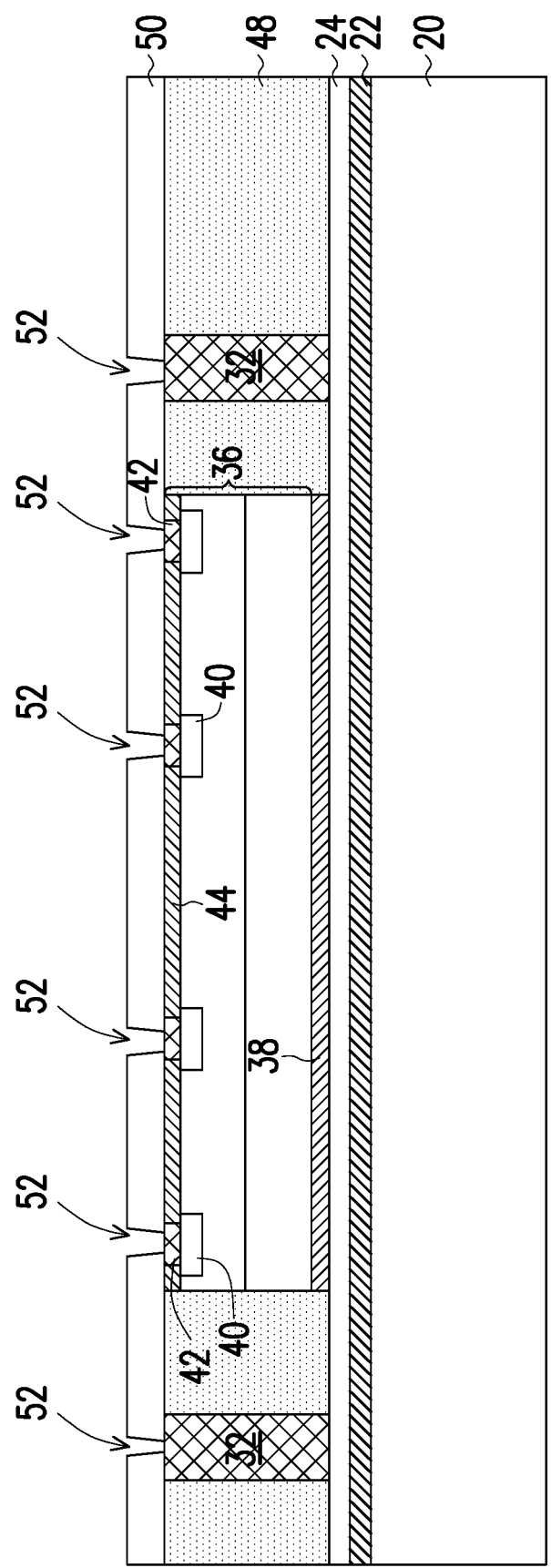

FIGS. 7 through 15 illustrate the formation of a front-side redistribution structure. FIGS. 7 through 10 illustrate the formation of a first layer of Redistribution Lines (RDLs), an alignment mark, and the respective dielectric layer. Referring to FIG. 7, dielectric layer 50 is formed. The respective process is illustrated as process 308 in the process flow shown in FIG. 30. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include coating, Chemical Vapor Deposition (CVD), Atomic Layer Deposition (ALD), Plasma-Enhanced Chemical Vapor Deposition (PECVD), or other applicable deposition methods. Via openings 52 are then formed. The respective process is also illustrated as process 308 in the process flow shown in FIG. 30. In accordance with some embodiments in which dielectric layer 50 is formed of a photo sensitive material such as PBO or polyimide, the formation of openings 52 involves a photo exposure using a lithography mask (not shown), and a development step. Through-vias 32 and metal pillars 42 are exposed through via openings 52.

Figure 8:
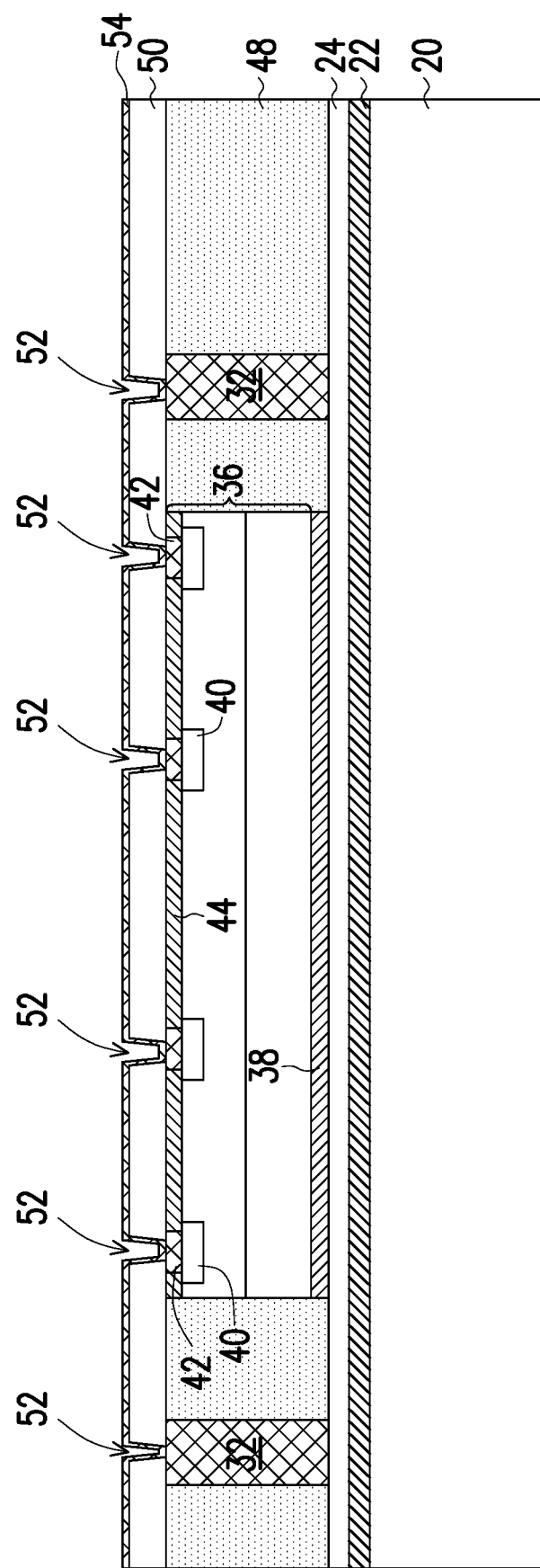

Next, referring to FIG. 8, metal seed layer 54 is deposited. In accordance with some embodiments of the present disclosure, metal seed layer 54 includes a titanium layer and a copper layer over the titanium layer. The formation method may include, for example, PVD. Metal seed layer 54 extends into openings 52, and contacts through-vias 32 and metal pillars 42.

Figure 9:
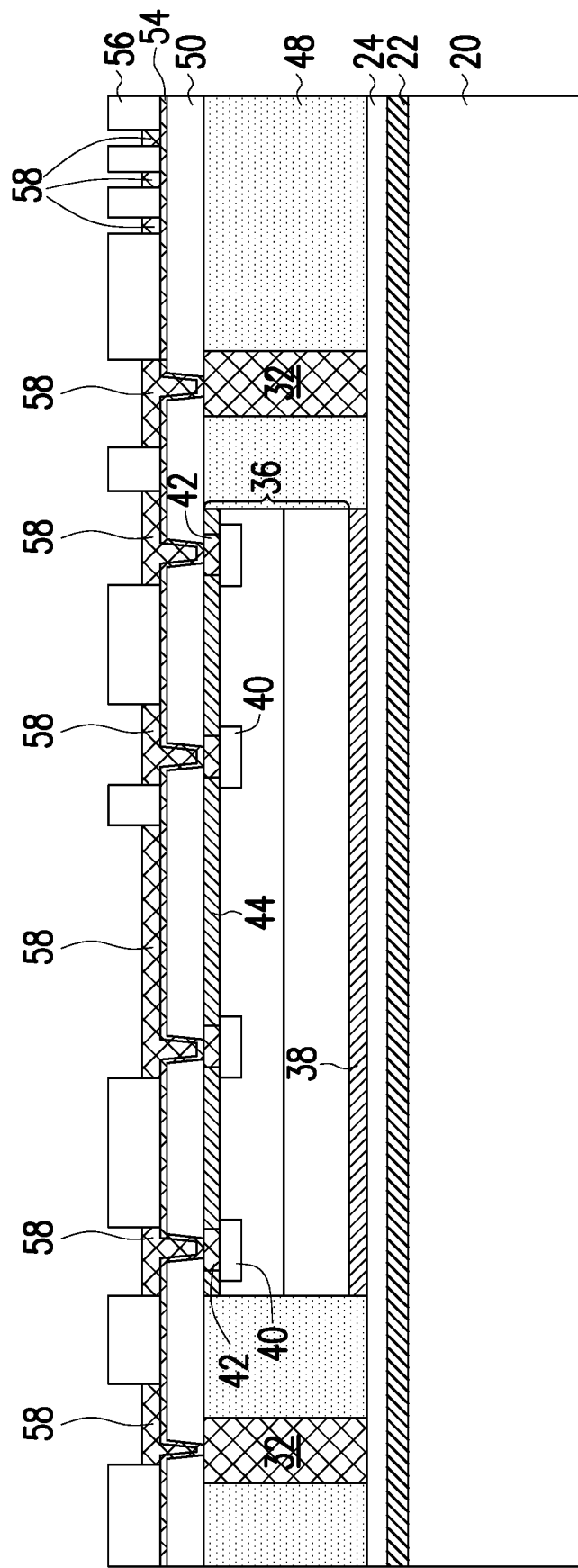

FIG. 9 illustrates the formation and the patterning of photo resist 56. Metal seed layer 54 has some portions exposed to the openings in photo resist 56. A plating process is then performed to form metal regions 58. In accordance with some embodiments of the present disclosure, metal regions 58 comprise copper or a copper alloy. The plating may include electro-chemical plating or electro-less plating.

Figure 10:
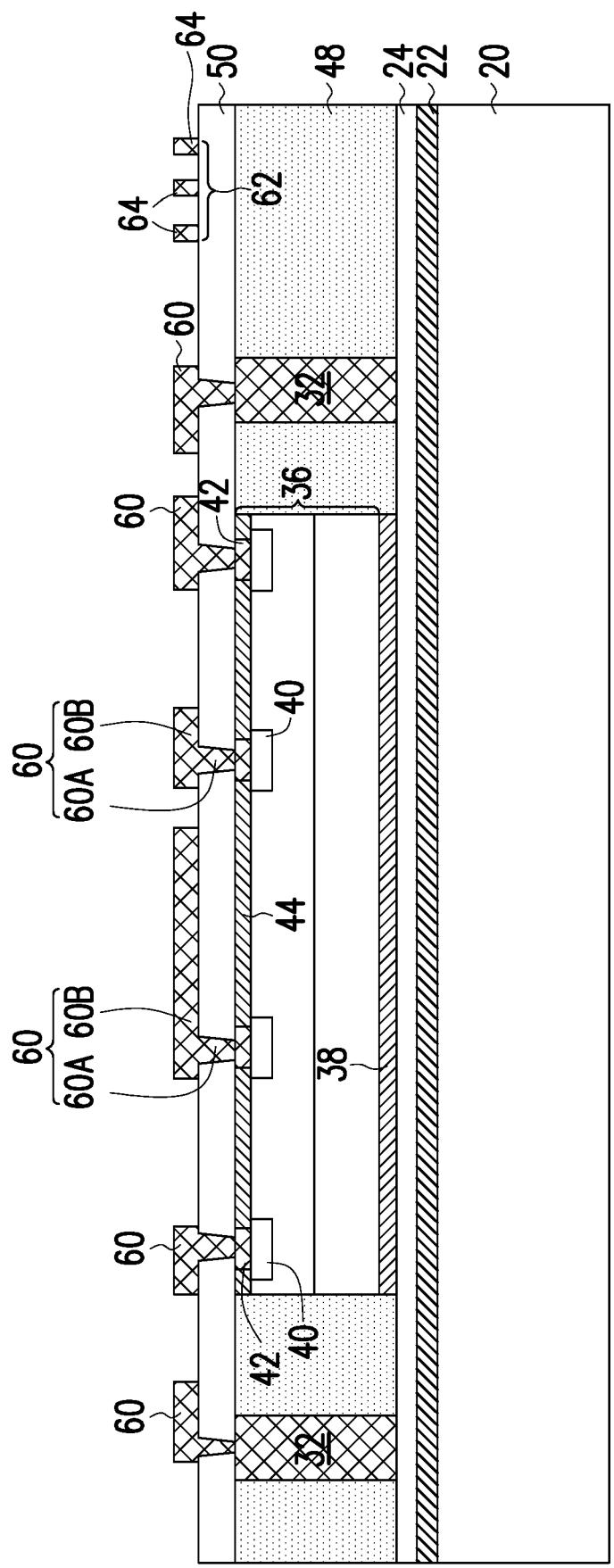
Figure 11:
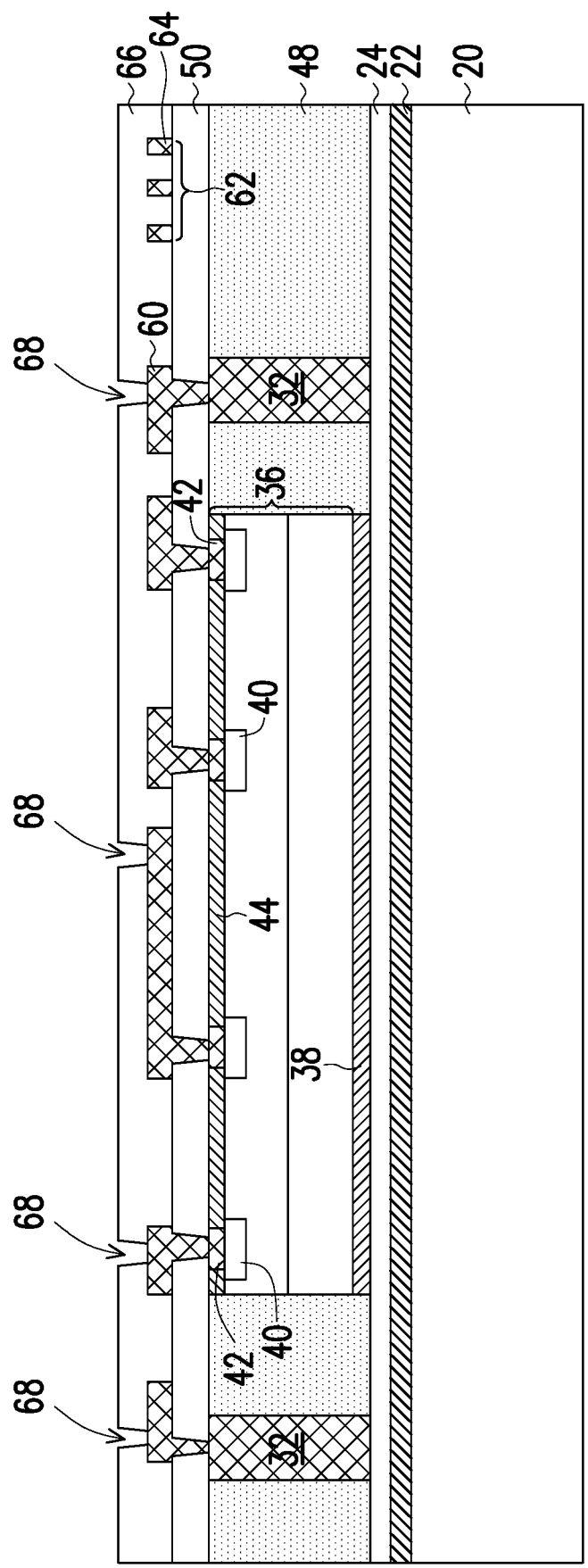

In a subsequent process, photo resist 56 is removed, and the underlying portions of metal seed layer 54 are exposed. One or a plurality of etching processes are then performed to remove the exposed metal seed layer 54. In accordance with some embodiments, a first etching process is performed to etch the copper layer in metal seed layer 54, followed by a second etching process to etch the titanium layer in metal seed layer 54. As a result, RDLs 60 and alignment mark 62 are formed, and the resulting structure is shown in FIG. 10. The respective process is illustrated as process 310 in the process flow shown in FIG. 30. Each of RDLs 60 and alignment mark 62 includes a remaining portion of metal seed layer 54 and a portion of the plated metal regions 58.

RDLs 60 include vias 60A formed in dielectric layer 50 to connect to metal pillars 42 or through-vias 32, and metal traces (metal lines) 60B over dielectric layer 50. Although not shown, the top surfaces of the portions of metal traces 60B grown from openings 52 (FIG. 8) may be recessed lower than the top surfaces of the portions of metal traces 60B directly overlying dielectric layer 50.

Alignment mark 62 includes a plurality of grating strips 64, which in combination form the alignment mark. Grating strips 64 also define the contour of alignment mark 62, and the shape of the contour may be used to identify alignment mark 62. The plurality of grating strips 64 in alignment mark 62 are electrically floating. Furthermore, each of strips 64 of alignment mark 62 may be fully isolated from other conductive features except other parts of alignment mark 62. Alternatively stated, the top surfaces, bottom surfaces, and the sidewalls of all grating strips 64 are in contact with either a dielectric material or another part of alignment mark 62. FIGS. 28A, 28B, 28C, and 28D illustrate the top views of some examples of alignment marks 62, each including a plurality of elongated metal strips 64. Elongated metal strips 64 may be parallel to each other, with each having a uniform width. Elongated metal strips 64 may have a uniform pitch, with pitches P1 and P2 equal to each other, for example. In accordance with some embodiments of the present disclosure, some of elongated metal strips 64 may have pitches different from the pitches of other metal strips 64, for example, with pitches P1 and P2 different from each other.

Figure 17:
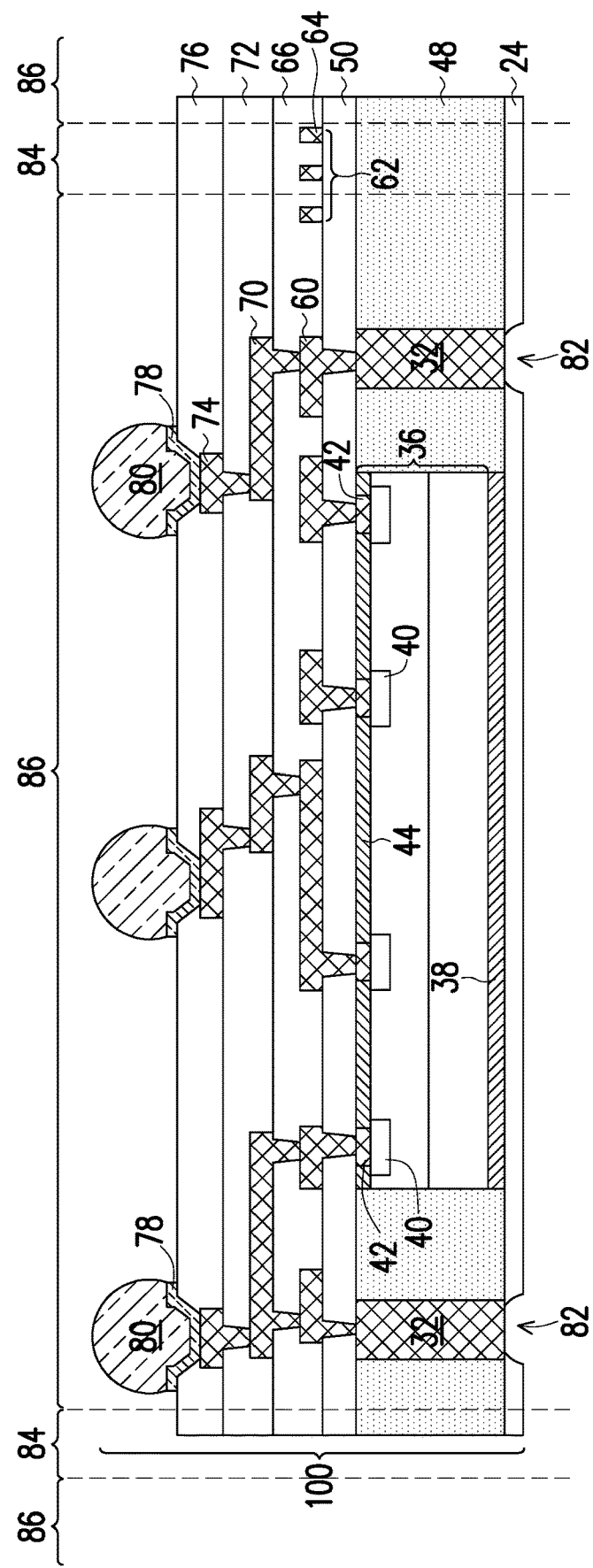

In accordance with some embodiments of the present disclosure, the width W1 (and W2) of alignment mark 62 are small, and may be close to the minimum allowed (or can be formed) width of the corresponding RDL. For example, width W1 and/or W2 may be between the minimum width and about 125 percent the minimum width. The minimum width is the width of metal strips 64 that is either the smallest width of the corresponding RDL that can be formed using the corresponding technology without incurring reliability problem such as the delamination between metal strips 64 and the underlying dielectric layer 50 (FIG. 11), and/or delamination between metal strips 64 and the overlying dielectric layer 66 (FIG. 17). It is appreciated that the minimum width is related to the process, the production tool, and the material of metal strips 64 and the neighboring dielectric layers. For example, the minimum width of the corresponding RDL may be due to process factors such as the limitation of photo resist or the lithography process. In accordance with some embodiments, when the widths of metal strips are smaller about 4 µm, delamination was observed. Accordingly, the widths W3 and W4 are greater than 4 µm. In accordance with some embodiments, widths W3 (and W4) is in the range between about 5 µm and about 10 µm. In accordance with some embodiments, at least some of metal strips 64 have a length-to-width ratio greater than about 5. The length-to-width ratio may also be greater than about 10 or greater, depending on the size of alignment mark 62, and the larger the alignment mark 62, the greater the length-to-width ratio can be. Making strips 64 to be elongated allows the widths of strips 64 to be minimized without the concern of delamination. Otherwise, if both the length and the width of the features 64 in alignment mark 62 are close to each other, features 64 need to be made larger in order to be free from delamination. In accordance with some embodiments of the present disclosure, lengths L1 and L2 of alignment mark 62 may in the range between 30 µm and about 120 µm, and width W1 and W2 of alignment mark 62 may in the range between 20 µm and about 120 µm.

Figure 28B:
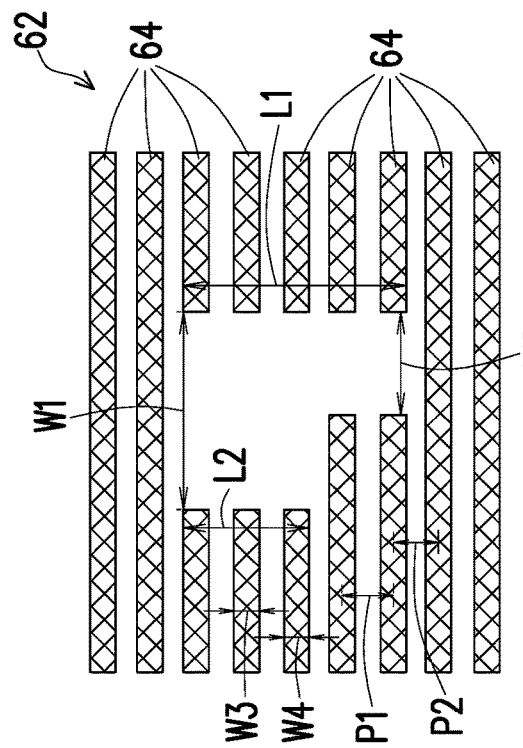
FIGS. 28A, 28B, 28C, and 28D illustrate the top views of some alignment marks in accordance with some embodiments.
Figure 28A:
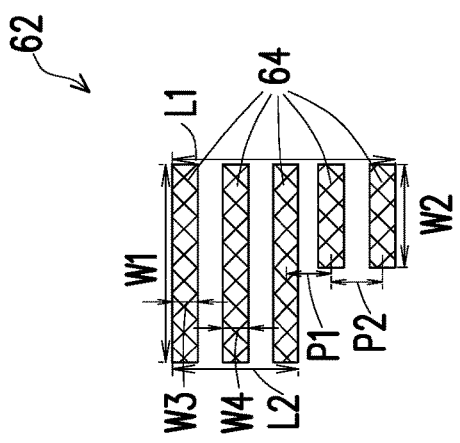

The alignment mark 62 as shown in FIG. 28A has a contour with a signature pattern, which has the shape of the letter "L" in the illustrated example. The signature pattern of alignment mark 62 may have other shapes including, and not limited to, crosses, rectangles, squares, or the like. The signature pattern of alignment mark 62 may also have the shapes of other letters such as letter "H," Letter "A," Letter "C," etc. The signature pattern, which is letter "L" in FIG. 28A, is defined by the outer contour of metal strips 64. The grating strips 64 themselves, how, do not form the lines in the letters directly. For example, if letter "H" is the signature pattern, since H includes two vertical line and a horizontal line connecting the two vertical lines, each of the two vertical line and the horizontal line may include a plurality of discrete grating strips.

FIG. 28B illustrates an example of alignment mark 62, which also includes a plurality of metal strips 64. The signature pattern, which is letter "L" in the example, in FIG. 28B, is defined by a void in metal strips 64, with metal strips 64 not extending into the void. Alternatively stated, the alignment mark as shown in FIG. 28B has an inversed pattern since the signature pattern "L" is defined by the void in metal strips 64, rather than metal strips 64.

Figure 28D:
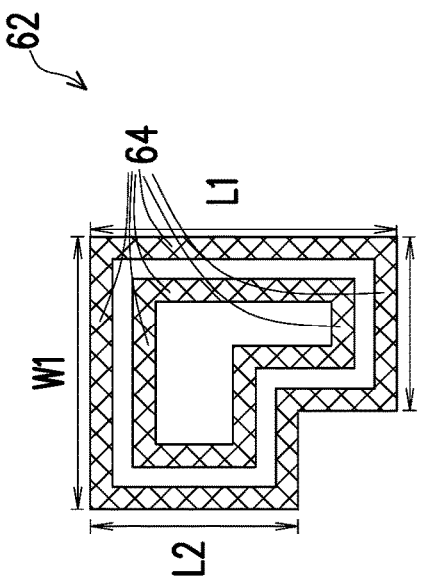
Figure 28C:
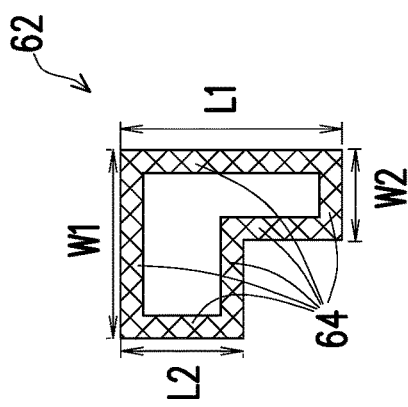

FIG. 28C illustrates alignment mark 62 in which metal strips 64 are connected to form a ring. Alternatively stated, the signature pattern in FIGS. 28C (and 28D) is a hollow pattern with grating strips lining the contour. In the embodiments as illustrated, the ring is fully closed. In accordance with other embodiment, the ring may be partially closed, for example, with one or two of the illustrated metal strips 64 in the illustrated ring not formed. FIG. 28D illustrates alignment mark 62 in which metal strips 64 are connected to form two rings, with the outer ring enclosing the inner ring. In accordance with some embodiments of the present disclosure, there may be a plurality of rings (with each being similar to what is shown in FIG. 28C) placed side by side, and the plurality of rings in combination form alignment mark 62. The plurality of rings may be placed with any directions, positions relative to each other.

Figures 1, 29A:
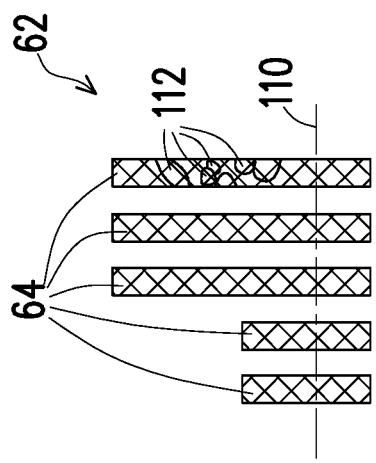
Figures 1, 29B:
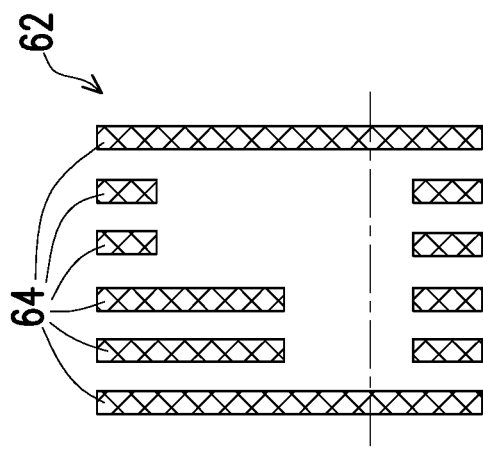
Figures 1, 29C:
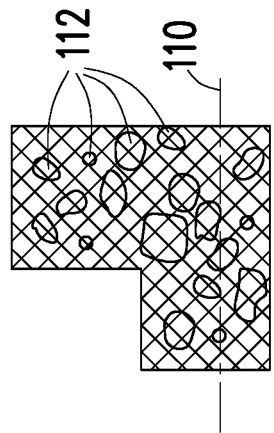
Figures 2, 29A:
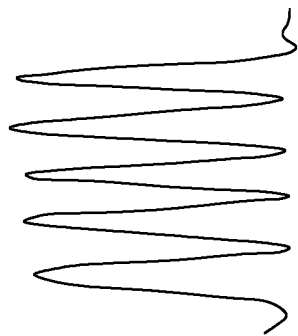
Figures 2, 29B:
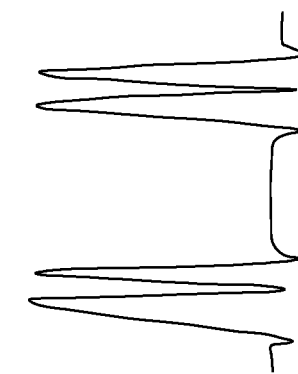
Figures 2, 29C:
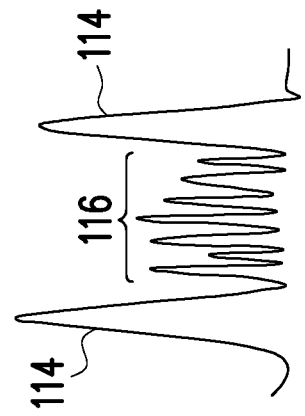

FIGS. 29A-1, 29A-2, 29B-1, 29B-2, 29C-1, and 29C-2 illustrate some examples of alignment marks and the corresponding signals measured from the alignment marks. FIGS. 29A-1, 29B-1, and 29C-1 are alignment marks. FIG. 29A-2 is the brightness-contrast signal intensity obtained from the alignment mark shown in FIG. 29A-1. FIG. 29B-2 is the brightness-contrast signal intensity obtained from the alignment mark shown in FIG. 29B-1. FIG. 29C-2 is the brightness-contrast signal intensity obtained from the alignment mark shown in FIG. 29C-1. The brightness-contrast signal intensity values represent the contrast of brightness when the alignment marks are scanned from left to right at the positions of lines 110 in FIGS. 29A-1, 29B-1, and 29C-1. Accordingly, the highest peaks of the signal intensity are at the edges of alignment marks.

Referring to FIG. 29C-1, which illustrates a bulk alignment mark, there are two edges crossed by line 110, with one on the left and one on the right. The signal intensity values of the two edges are reflected in FIG. 29C-2 as peaks 114. FIG. 29C-1 also illustrates a plurality of grains 112 in alignment marks. Grains 112 may be the grains of copper, for example. The grains 112 and the surrounding parts of the respective alignment mark have difference in brightness, which results in the contrast in brightness, and hence peaks 116 in FIG. 29C-2 are generated. Peaks 116 are lower than peaks 114. Peaks 114 are used to determine where the boundaries of alignment marks are, and peaks 116 act as the noise that adversely affect the determination of the boundaries (hence the image) of the alignment mark. In the manufacturing process, there may be dielectric layers (such as layers 66, 72, and 76 in FIG. 17) covering alignment marks, causing the image of alignment marks to be blurred. The different between the heights of peaks 114 and peaks 116 thus will be reduced. Furthermore, the alignment marks may be damaged in certain process steps, such as the steps shown in FIG. 22. This also causes the reduction of the different between the heights of peaks 114 and 116.

Referring to FIG. 29A-1, metal strips 64 in accordance with some embodiments of the present disclosure have small widths, which means the grains in metal strips 64 will be limited inside the narrow metal strips. The roughness of the metal strips 64 is thus reduced, and the peaks resulting from the grain boundaries (rather than the edges of metal strips 64) are at least lowered, and possibly eliminated. FIG. 29A-2 schematically illustrates a part of the signal intensity measured from the alignment mark 62 shown in FIG. 29A-1. It is observed that no peaks are generated from grain boundaries, and hence the signals resulted from the edges of metal strips are more significant, and are easier to be distinguished. This results in the improvement in the imaging of alignment marks since the edges of alignment marks are identified through the brightness-contrast signals.

FIG. 29B-2 schematically illustrates a part of the brightness-contrast signal intensity measured from the alignment mark shown in FIG. 29B-1, which has an inversed pattern. It is observed that the peaks resulted from the grain boundaries are also not present, and hence the signals resulted from the edges of metal strips are more significant, and are easier to be distinguished.

Comparing the signals shown in FIGS. 29A-2, 29B-2, and 29C-2, it is found that even if the brightness-contrast signal is less clear than what are shown due to the more overlying dielectric layers and/or the damage of the alignment marks, the brightness-contrast signals shown in FIGS. 29A-2 and 29B-2 are still much easier to be used to determine the positions of the alignment marks than the signals shown in FIG. 29C-2. Accordingly, the alignment marks with grating patterns are improved over the bulk alignment marks such as what is shown in FIG. 29C-1.

For the easy identification of the patterns, the alignment marks 62 may not be a grid pattern that includes a first plurality of parallel strips and a second plurality of parallel strips crossing, and perpendicular to, the first plurality of parallel strips. The grid pattern makes the distinguishing of the alignment marks to be more difficult.

Referring back to FIG. 11, dielectric layer 66 is formed over the structure shown in FIG. 10. The respective process is illustrated as process 312 in the process flow shown in FIG. 30. Via openings 68 are then formed in dielectric layer 66. The respective process is illustrated as process 314 in the process flow shown in FIG. 30. Dielectric layer 66 covers alignment mark 62 and RDLs 60. Some portions of RDLs 60 are exposed through the via openings. Dielectric layer 66 may be formed using a material selected from the same group of candidate materials for forming dielectric layer 50, which may include PBO, polyimide, BCB, or other organic or inorganic materials.

Figure 12:
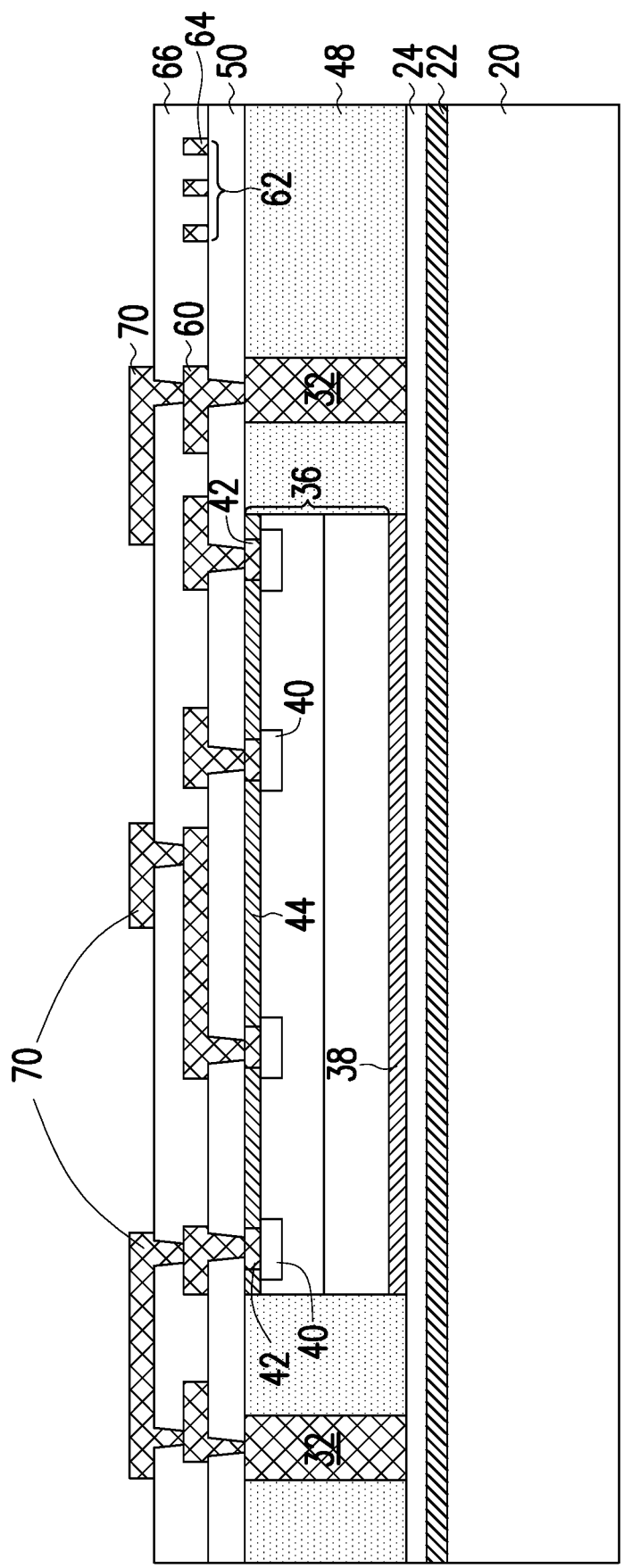

Referring to FIG. 12, RDLs 70 are formed. The respective process is also illustrated as process 314 in the process flow shown in FIG. 30. The formation process of RDLs 70 may be essentially the same as the formation of RDLs 60. RDLs 70 also include via portions extending into the via openings in dielectric layer 66 to contact RDLs 60, and metal trace portions directly over dielectric layer 66. The formation of RDLs 70 may include forming a metal seed layer, forming a patterned mask (such as a photo resist), plating RDLs 70, and then removing the patterned mask and undesirable portions of the seed layer.

In the formation of openings 68 (FIG. 11) and the formation of RDLs 70 (FIG. 12), alignment mark 62 is used to align the positions of openings 68 and the trace portions of RDLs 70 to the desirable positions. In the alignment, alignment mark 62 is first found, and then the positions of openings 68 and RDLs 70 are determined based on the position of alignment mark 62. It is appreciated that there may be multiple alignment marks in the package, with each on a side of the respective die. Alignment mark 62 is viewed from top through transparent (or at least partially transparent) dielectric layer 66. By adopting the grating patterns, alignment mark 62 can be clearly visible, and the accuracy in the alignment is improved.

Figure 13:
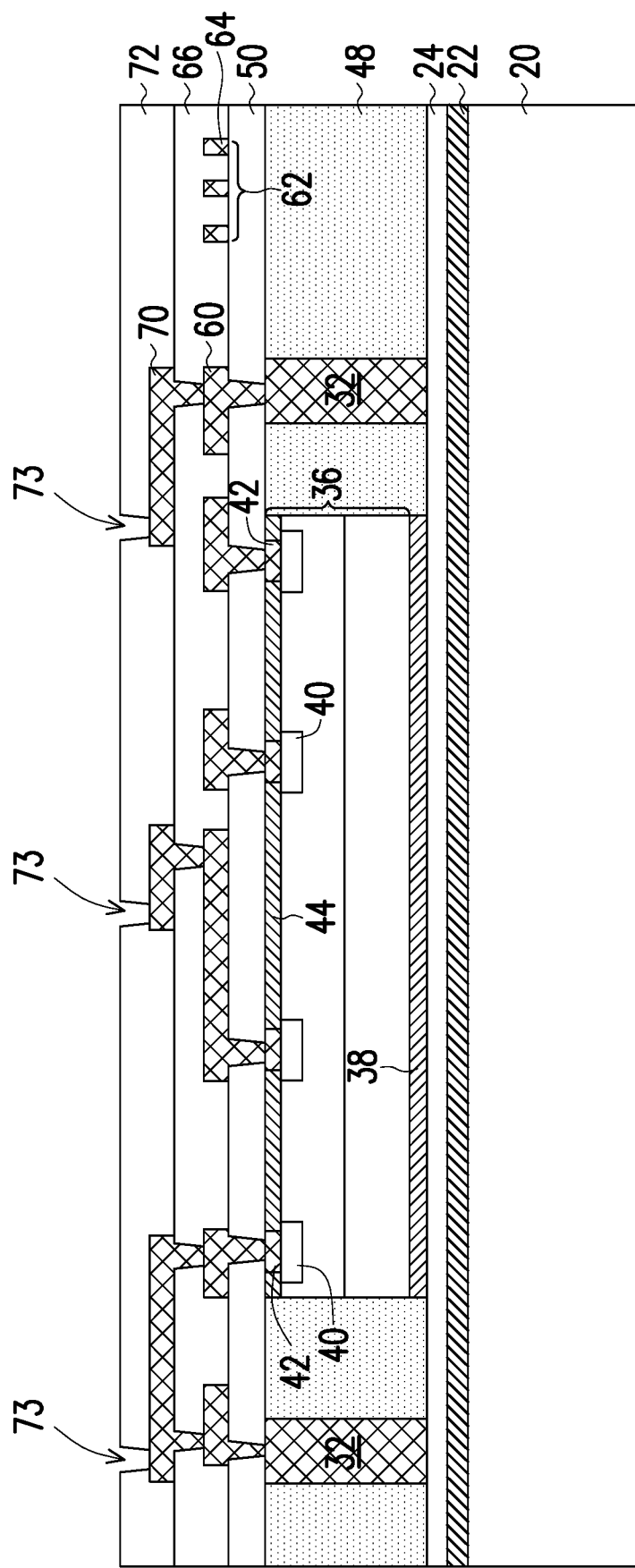

FIG. 13 illustrates the formation of dielectric layer 72 over dielectric layer 66 and RDLs 70. The respective process is illustrated as process 316 in the process flow shown in FIG. 30. Next, via openings 73 are formed in dielectric layer 72. The respective process is illustrated as process 318 in the process flow shown in FIG. 30. Dielectric layer 72 may be formed of a material selected from the same group of candidate materials for forming dielectric layers 50 and 66.

Figure 14:
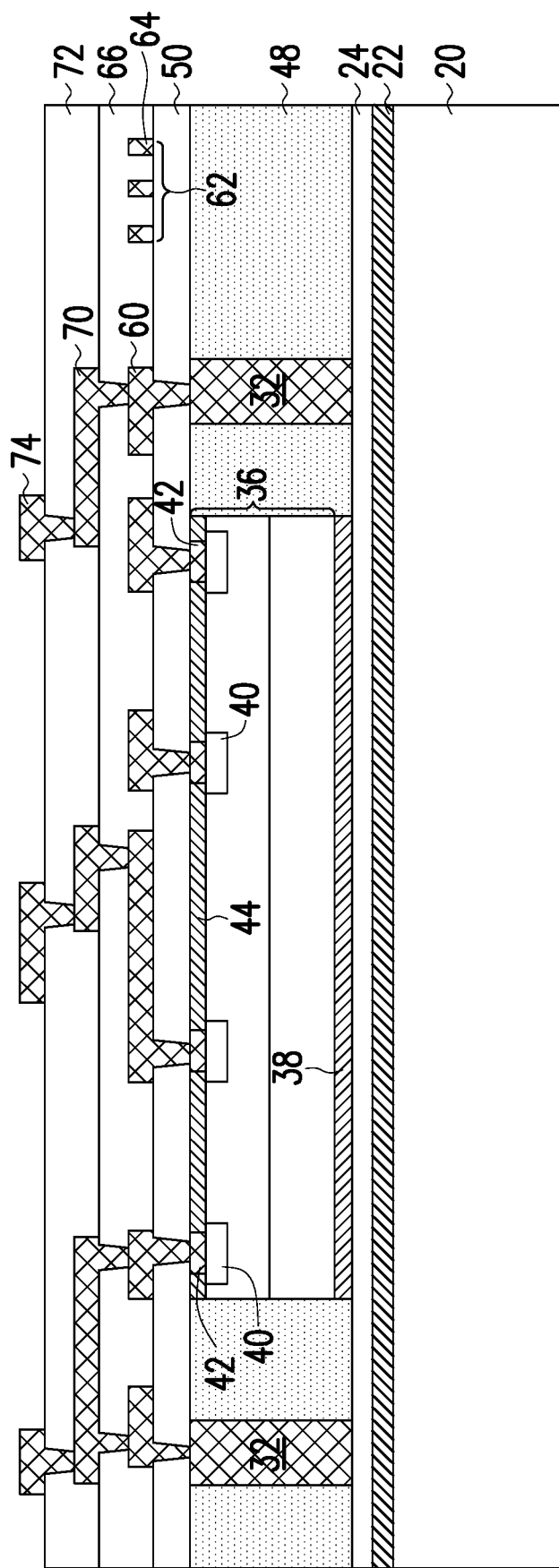

Referring to FIG. 14, RDLs 74 are formed. The respective process is also illustrated as process 318 in the process flow shown in FIG. 30. The formation process of RDLs 74 may be essentially the same as the formation of RDLs 60. RDLs 74 may be formed of a metal or a metal alloy including aluminum, copper, tungsten, or alloys thereof. It is appreciated that although in the illustrated examples of embodiments, three layers of RDLs (60, 70 and 74) are formed, the package may have other number of RDL layers such as one layer, two layers, or more than three layers.

In the formation of RDLs 74, alignment mark 62 is used to align the positions of RDLs 74 (and the positions of the corresponding via portions) to RDLs 70. Alignment mark 62 is viewed from top through transparent (or at least partially transparent) dielectric layers 72 and 66. By adopting the grating patterns, alignment mark 62 can be clearly visible (with a high clarity score judged by the production tool used for alignment) through dielectric layers 72 and 66, and the accuracy in the alignment is improved. As a comparison, if the bulk pattern such as what is shown in FIG. 29C-1 is adopted, the determination of the alignment mark is more likely to fail.

Figure 15:
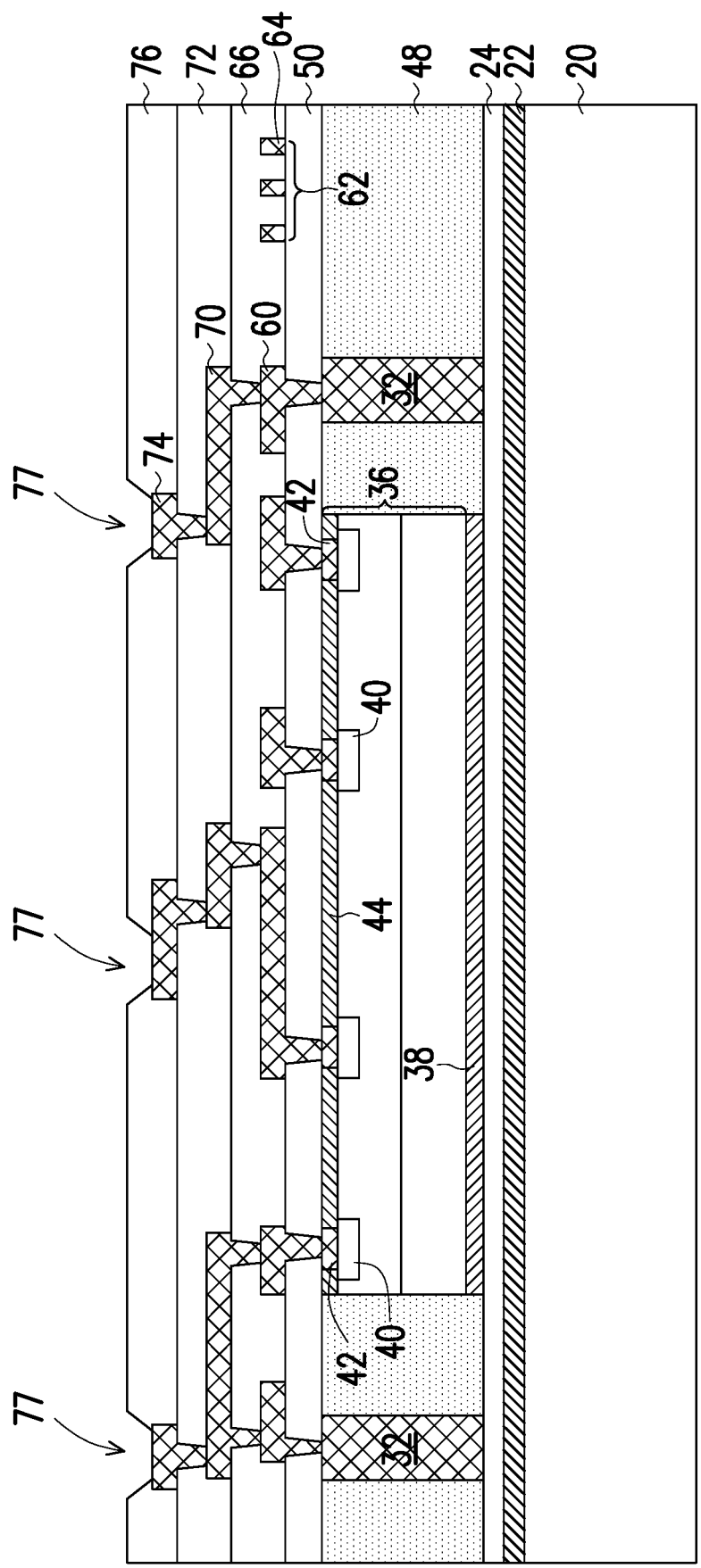

FIG. 15 illustrates the formation of dielectric layer 76. Dielectric layer 76 may be formed of a material selected from the same group of candidate materials for forming dielectric layers 50, 66, and 72. For example, dielectric layer 76 may be formed using PBO, polyimide, or BCB. Openings 77 are formed in dielectric layer 76 to expose the underlying metal pads, which are parts of RDLs 74. The positions of openings 77 may also be determined using alignment mark 62 for alignment, which is visible through dielectric layers 76, 72, and 66.

Figure 16:
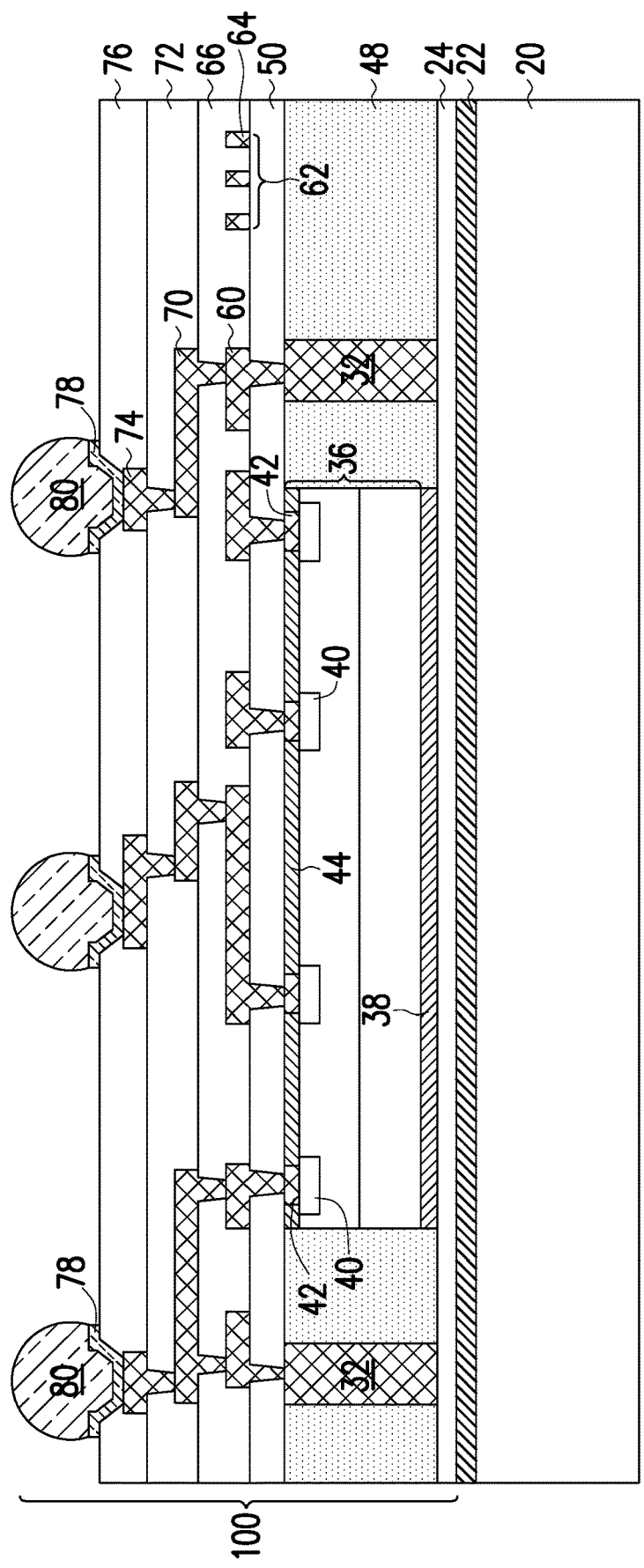

FIG. 16 illustrates the formation of Under-Bump Metallurgies (UBMs) 78 in accordance with some embodiments. The respective process is illustrated as process 320 in the process flow shown in FIG. 30. In accordance with some embodiment of the present disclosure, UBMs 78 are formed to extend into the openings in dielectric layer 76 in order to contact the metal pads in RDLs 74. UBMs 78 may be formed of nickel, copper, titanium, or multi-layers thereof. In accordance with some embodiments, UBMs 78 include a titanium layer and a copper layer over the titanium layer.

Electrical connectors 80 are then formed in accordance with some embodiments. The formation of electrical connectors 80 may include placing solder balls on the exposed portions of UBMs 78, and then reflowing the solder balls. In accordance with alternative embodiments of the present disclosure, the formation of electrical connectors 80 includes performing a plating step to form solder layers over UBMs 78, and then reflowing the solder layers. Electrical connectors 80 may also include non-solder metal pillars, or metal pillars and solder caps over the non-solder metal pillars, which may also be formed through plating. Throughout the description, the structure including dielectric buffer layer 24 and the overlying structure in combination is referred to as package 100, which is a composite wafer (and also referred to as composite wafer 100 hereinafter) including a plurality of device dies 36.

Next, composite wafer 100 is demounted from carrier 20, for example, by projecting a laser beam on release film 22. Release film 22 is decomposed under the heat of the laser beam. The resulting composite wafer 100 is illustrated in FIG. 17. Next, openings 82 are formed in dielectric buffer layer 24, for example, through laser drilling. When through-vias 32 includes titanium layers at their bottoms, and the titanium layers come from the metal seed layer 25 (FIG. 2), the titanium layer may be removed through etching, hence exposing the copper in through-vias 32.

Composite wafer 100 may then be singulated in a die-saw step. The respective process is illustrated as process 322 in the process flow shown in FIG. 30. For example, a blade may saw-through the scribe lines 84 to separate wafer 100 into a plurality of identical packages 86, each having the structure as illustrated in accordance with some examples. The die-saw may pass through some or all of alignment mark 62. As a result, the a resulting packages 86 may include a part of alignment mark 62, or does not include any part of alignment mark 62 since alignment mark 62 has been cut in the die-saw. For example, package 86 may include an entirety of one or more of the metal strips 64 (FIGS. 28A through 28D), and/or may include a part of one or more of metal strips 64, depending on the sawing. For example, in FIGS. 28A through 28C, the left parts of alignment marks 62 may be sawed, while the right parts of alignment marks 62 are left in the final package 86, or vice versa. It is also possibly that the upper parts of alignment marks 62 are sawed, while the lower part of alignment marks 62 are left in the final package 86, or vice versa. The sawed percentage of alignment marks 62 may be any percentage of the illustrated portions.

Figure 18:
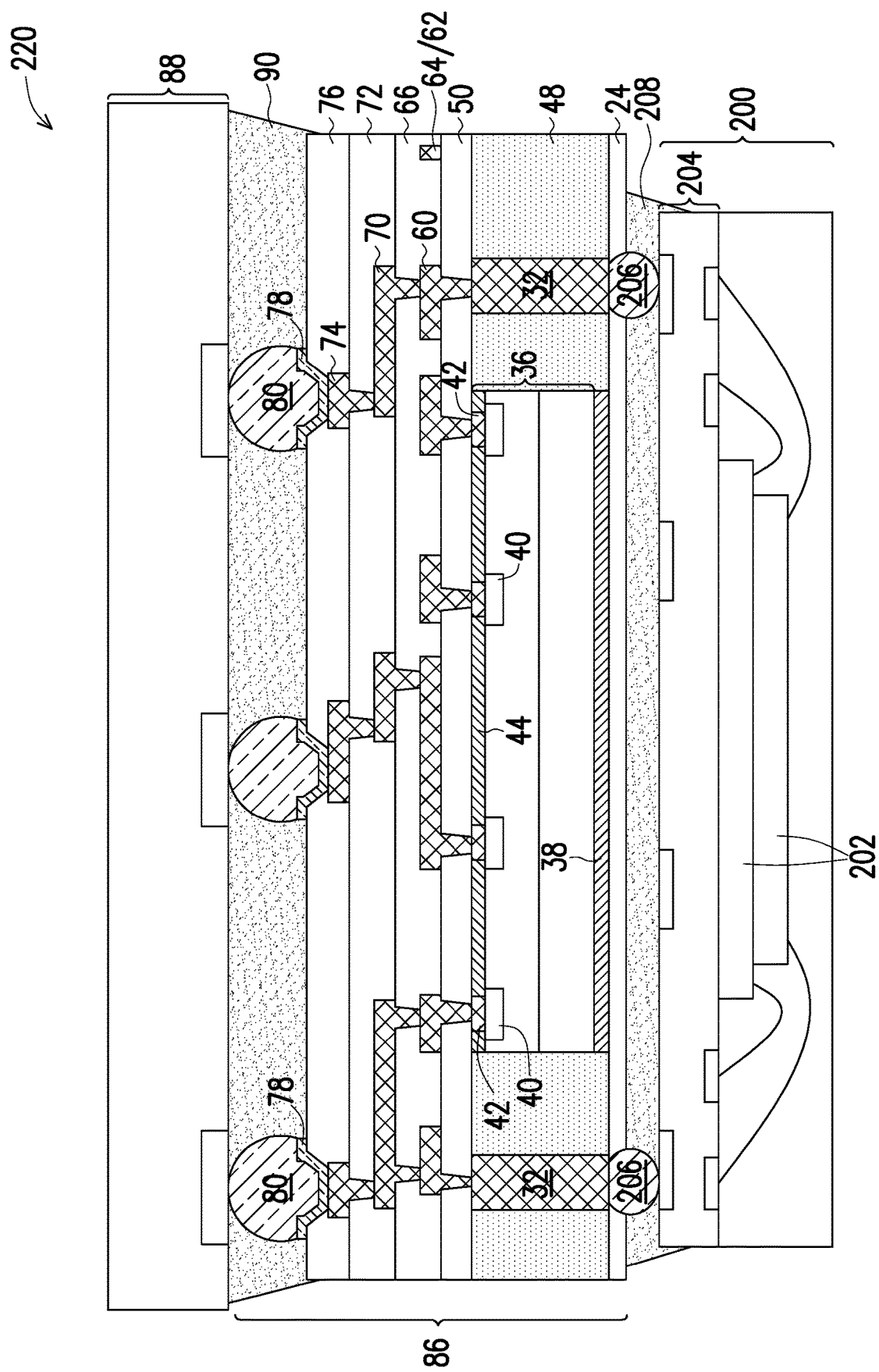

FIG. 18 illustrates the bonding of package 86 to package component 88 through solder regions 80. In accordance with some embodiments of the present disclosure, package component 88 is a package substrate, which may be a coreless substrate or a substrate having a core. In accordance with other embodiments of the present disclosure, package component 88 is a printed circuit board or a package. Underfill 90 may be dispensed between package 86 and package component 88. Package 86 may also be bonded to package 200 through solder regions 206. In accordance with some embodiments, package 200 includes device dies 202 and substrate 204. Dies 202 may be memory dies such as Dynamic Random Access Memory (DRAM) dies. Underfill 208 may be disposed between package 86 and package 200. The resulting package in FIG. 18 is referred to as package 220.

FIGS. 19 through 27 illustrate the cross-sectional views of intermediate stages in the formation of packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 18. The details regarding the formation process and the materials of the components shown in FIGS. 19 through 27 may thus be found in the discussion of the embodiments shown in FIGS. 1 through 18.

Figure 19:
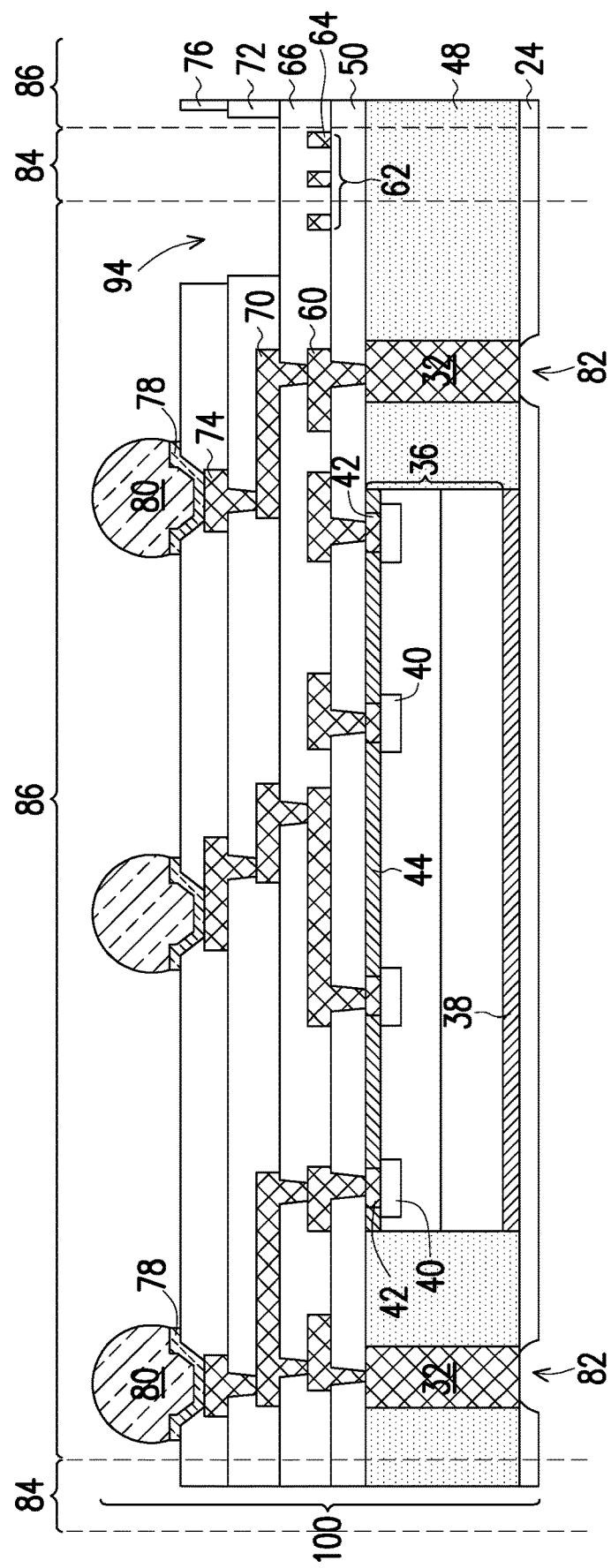
FIGS. 19 and 20 illustrate intermediate stages in the formation of a package in accordance with some embodiments.
Figure 20:
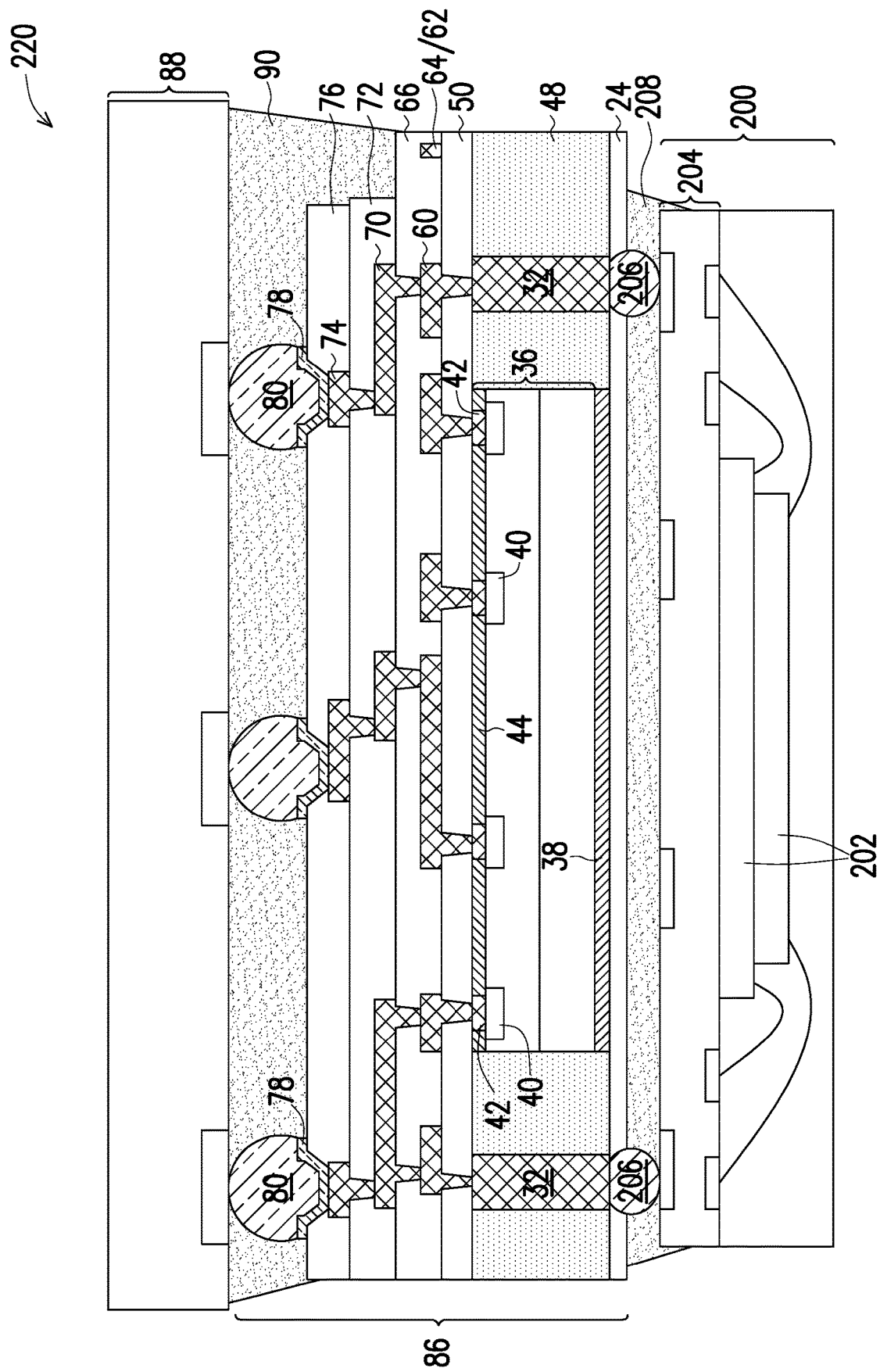
Figure 21:
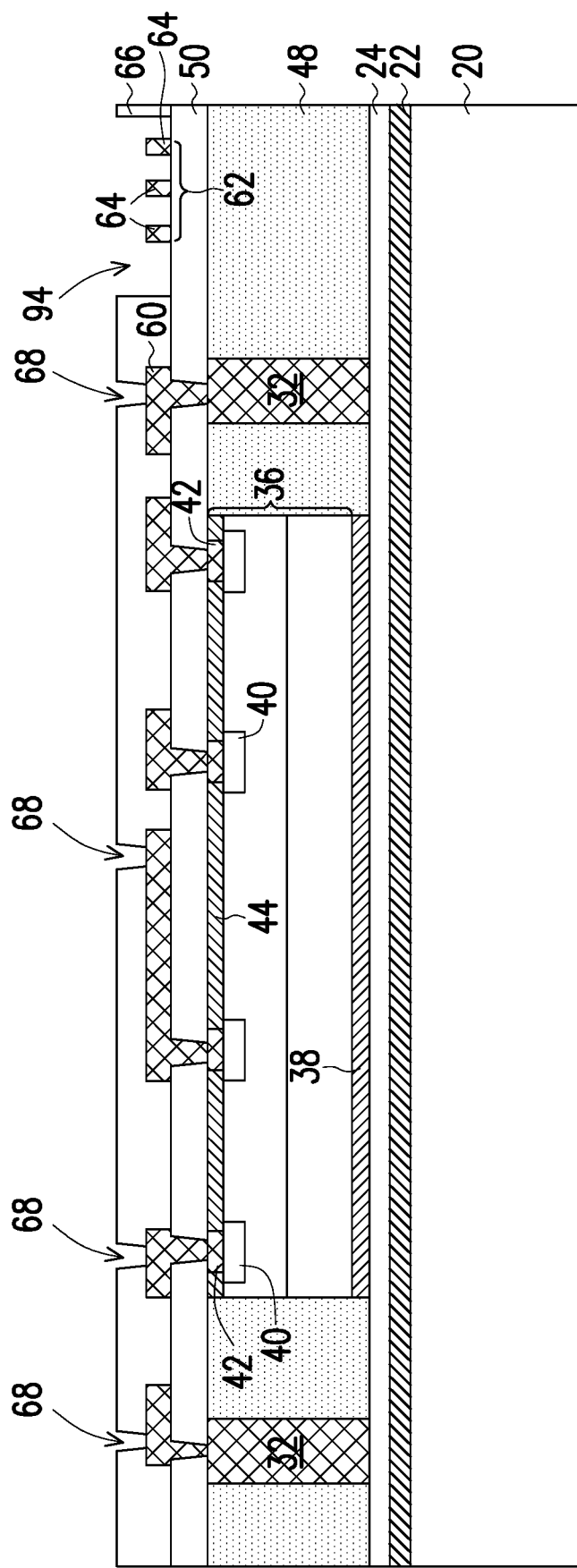
FIGS. 21 through 27 illustrate the cross-sectional views of intermediate stages in the formation of a package in accordance with some embodiments.

FIGS. 19 and 20 illustrate some embodiments. These embodiments are similar to the embodiments in FIGS. 1 through 18, except that the portions of dielectric layers 72 and 76 are opened for a clearer view of alignment mark. The resulting package 86 is shown in FIG. 19. The formation process of package 86 is similar to what are shown in FIGS. 1 through 18, except opening 94 is formed, and opening 94 penetrates through dielectric layers 72 and 76. Opening 94 includes two portions, with the first portion in dielectric layer 72, and the second portion in dielectric layer 76. The first portion of opening 94 is formed in the same process for forming the openings 73 in FIG. 13. The lithography mask is modified so that when openings 73 are formed, the lower portion of opening 94 is formed. The second portion of opening 94 is formed in the same process for forming the openings 77 in FIG. 15. The lithography mask is modified so that when openings 77 are formed, the upper portion of opening 94 is formed. Since dielectric layer 76 will be filled into opening 94, when the upper portion of opening 94 is formed, the portion of dielectric layer 76 filling the lower portion of opening 94 is also removed.

FIG. 20 illustrates the package 220 including package 86, and packages 88 and 200 bonded to package 86. Underfill 90 extends into the remaining port of opening 94 (if any is left).

FIGS. 21 through 27 illustrate the intermediate stages in the formation of packages in accordance with some embodiments. These embodiments are similar to the embodiments in FIGS. 1 through 18, except that the portions of dielectric layers 66, 72 and 76 directly over alignment mark 62 are all opened for a clearer view of alignment mark 62. Accordingly, when alignment mark 62 is used for aligning the formation of RDLs 70, 74, and UBMs 78, alignment mark 62 is exposed.

The initial processes in accordance with these embodiments are similar to what are shown in FIG. 10. Next, referring to FIG. 21, dielectric 66 is formed, followed by the formation of openings 68 and 94. Alignment mark 62 is exposed to opening 94. Also, the top surface of dielectric layer 50 is also exposed to opening 94.

Figure 22:
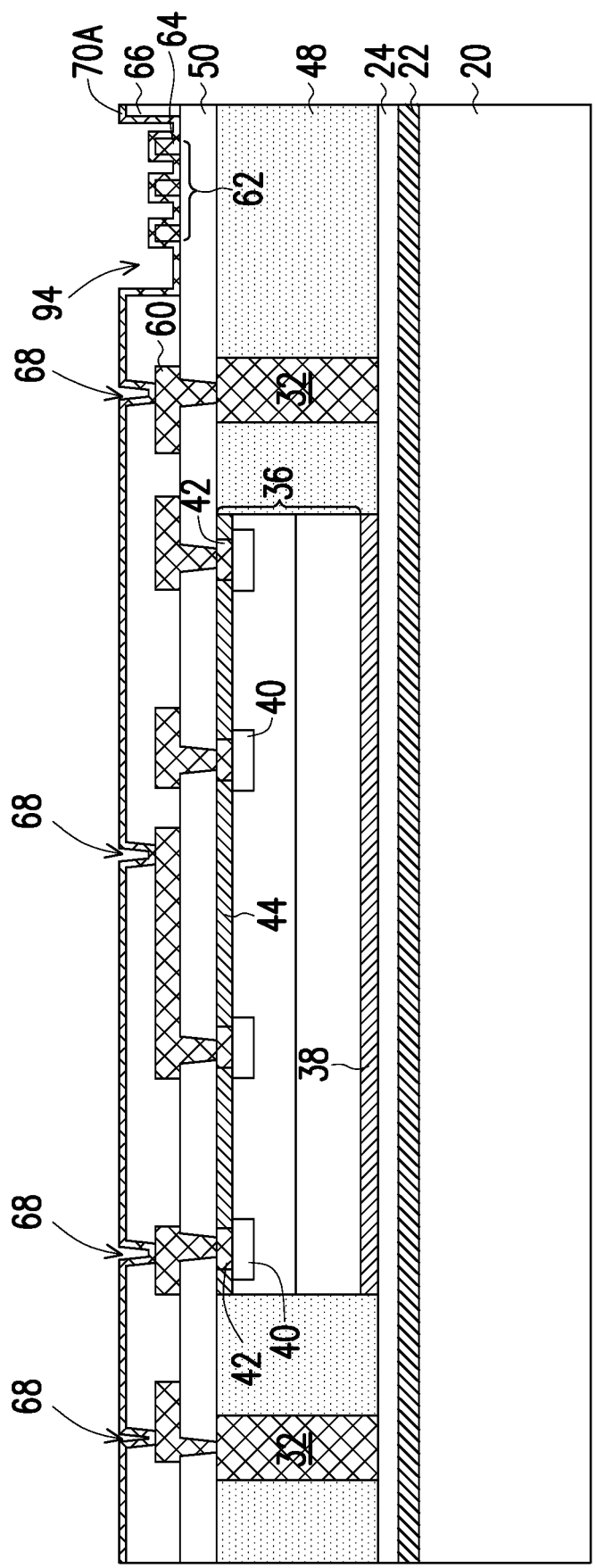
Figure 23:
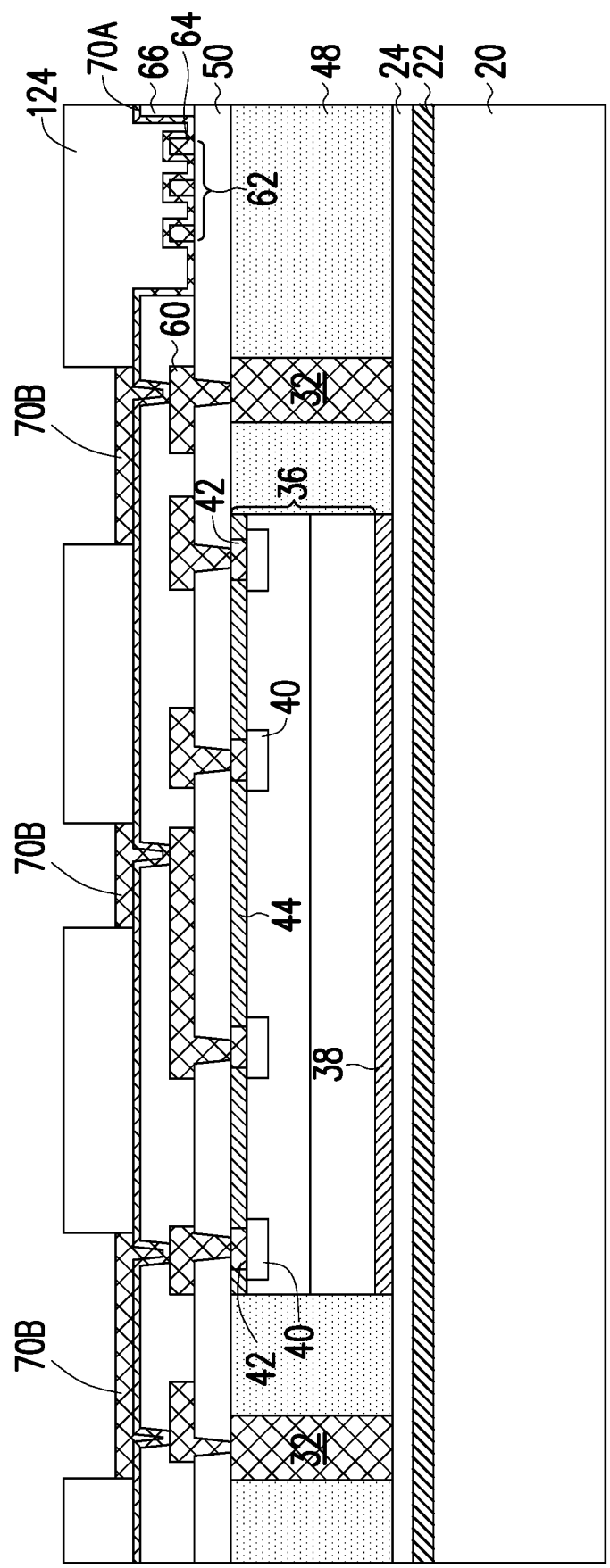
Figure 24:
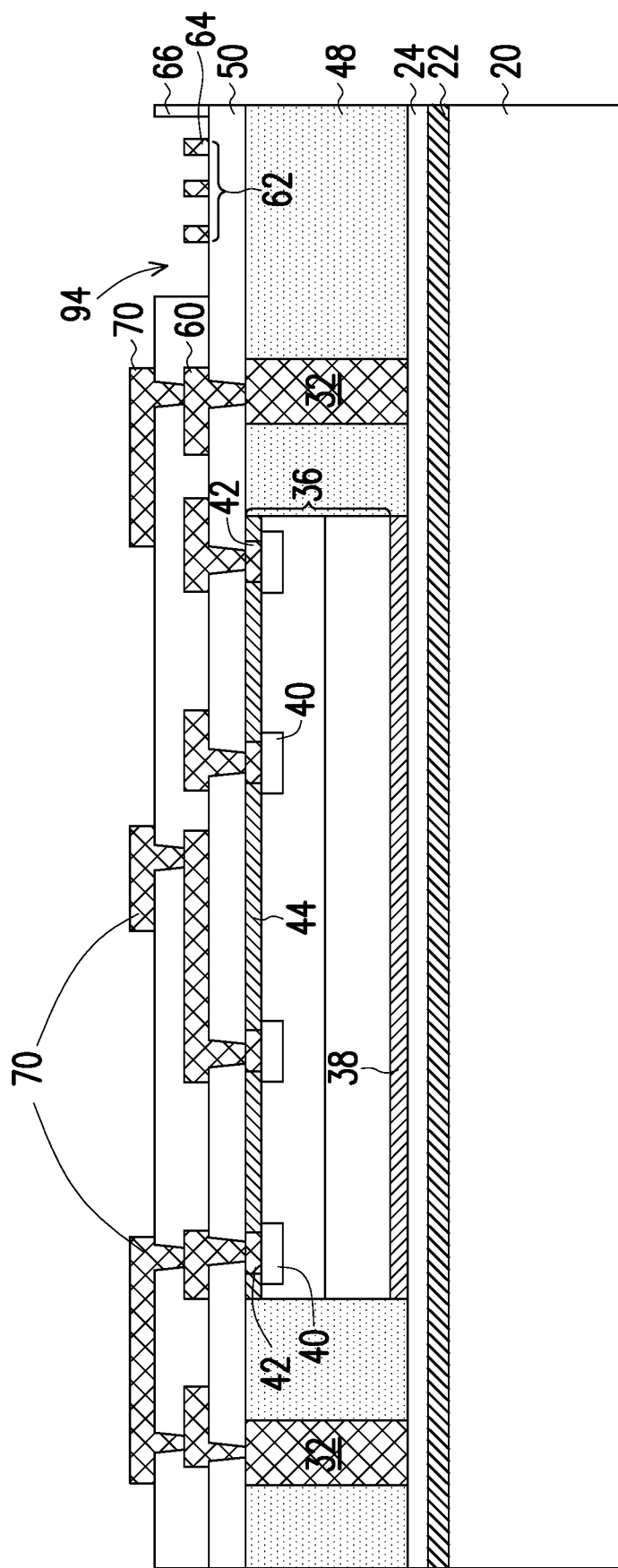

FIG. 22 illustrates the formation of metal seed layer 70A, which may include a titanium layer and a copper layer over the titanium layer in accordance with some embodiments of the present disclosure. Metal seed layer 70A extends into openings 68 and 94. Next, referring to FIG. 23, photo resist 124 is formed and then patterned. An entirety of opening 94 is filled by photo resist 124.

Next, metal regions 70B are plated into the openings in photo resist 124, followed by the removal of photo resist 124. Some portions of metal seed layer 70A are then exposed. The exposed portions of metal seed layer 70A are then etched, revealing the underlying alignment mark 62. RDLs 70 are also formed, and include metal seed layer 70A and metal regions 70B. In the etching of metal seed layer 70A, alignment mark 62 is also subject to damage. By adopting the grating patterns, however, alignment mark 62 can still be clearly viewed even with the damage.

Figure 25:
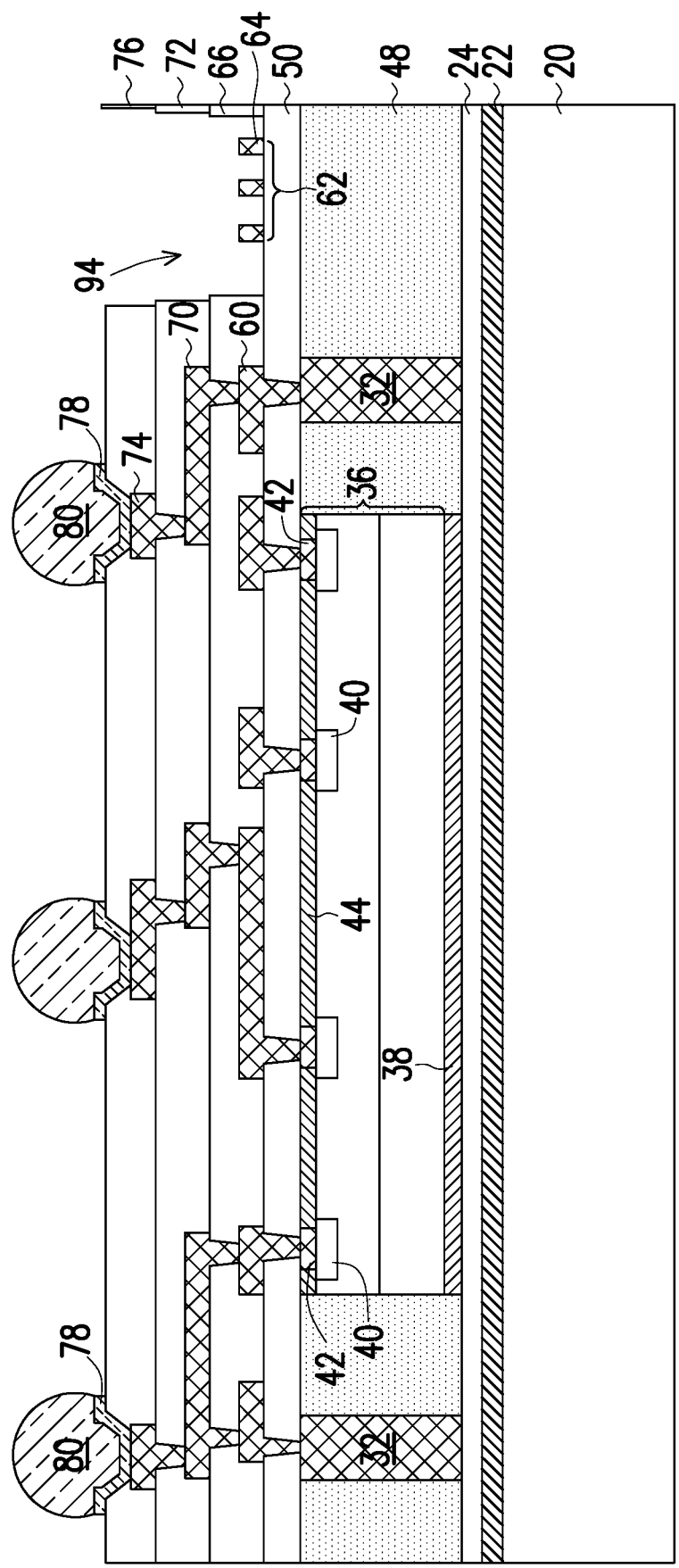
Figure 26:
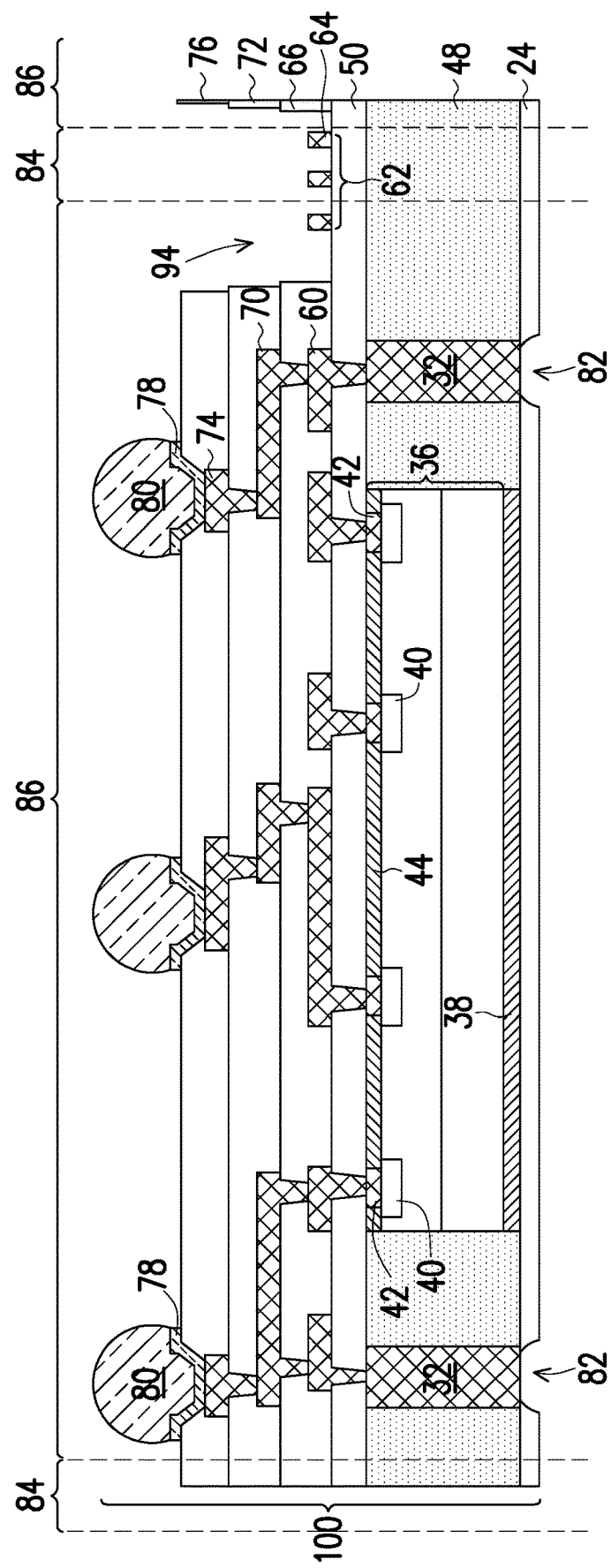
Figure 27:
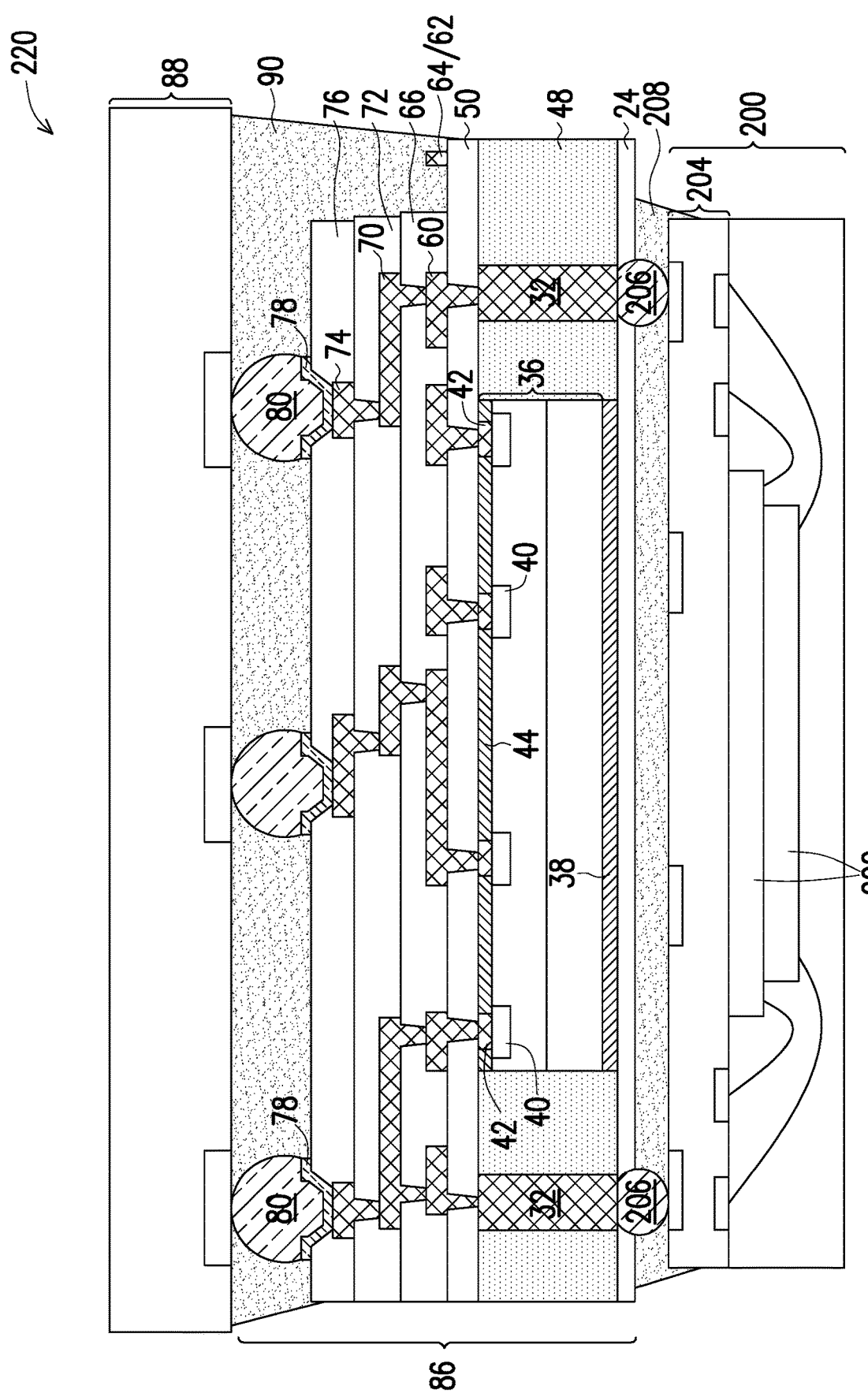

FIG. 25 illustrates the formation of overlying structures, which are similar to what are shown in FIG. 16. During the formation of RDLs 74 and UBMs 78, a metal seed layer (not shown) may also be formed on alignment mark 62 and then etched. Alignment mark 62 thus suffers from further damage. By adopting the grating patterns, however, alignment mark 62 can still be clearly viewed even with the further damage. FIG. 26 illustrates the demounting of wafer 100 from the respective carrier 20 (FIG. 25), and the sawing of wafer 100 into packages 86. The sawing passes through scribe lines 84, and some or all of alignment mark 62 are removed, as discussed referring to FIG. 17. FIG. 27 illustrates the resulting package 220.

In above-illustrated examples of the embodiments, some examples of processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By adopting grating patterns and form elongate and narrower strips for alignment marks, it is easy to distinguish the alignment marks. The production tool used for alignment may provide scores for the alignment marks that are viewed in the manufacturing of the packages. The scores range between 0 and 100, with the score of 0 meaning no alignment mark is found, and the score of 100 meaning a perfect alignment mark image. The alignment mark images with the scores over 70 are acceptable. The experimental results revealed that when a bulk alignment mark as shown in 29C-1 has a score of 42 or 50, which means not acceptable, the alignment mark shown in FIGS. 29A-1 and 29B-1 still have the scores higher than about 95 when all other conditions are the same. Also, experimental results revealed that even if there are a plurality of dielectric layers over the grating alignment mark, the scores can still be maintained over 90.

In accordance with some embodiments of the present disclosure, a method of forming a semiconductor device includes encapsulating a device die in an encapsulating material, forming a first dielectric layer over the device die and the encapsulating material, forming first redistribution lines extending into the first dielectric layer to electrically couple to the device die, forming an alignment mark over the first dielectric layer, wherein the alignment mark includes a plurality of elongated strips, forming a second dielectric layer over the first redistribution lines and the alignment mark, and forming second redistribution lines extending into the second dielectric layer to electrically couple to the first redistribution lines. The second redistribution lines are formed using the alignment mark for alignment. In an embodiment, the forming the second redistribution lines comprises forming via openings in the second dielectric layer, wherein portions of the first redistribution lines are exposed to the via openings, and the via openings are formed using the alignment mark for alignment. In an embodiment, the plurality of elongated strips in the alignment mark are parallel to each other, and are physically separated from each other. In an embodiment, the plurality of elongated strips in the alignment mark are interconnected to form a ring. In an embodiment, the plurality of elongated strips in the alignment mark each has a length/width ratio greater than about 5. In an embodiment, the plurality of elongated strips in the alignment mark each has a width close to a minimum width allowed by a formation process of the alignment mark. In an embodiment, the first redistribution lines and the alignment mark are formed in a common formation process. In an embodiment, the alignment mark is formed in a scribe line, and the method further comprises cutting through the scribe line and the alignment mark.

In accordance with some embodiments of the present disclosure, a method of forming a semiconductor device includes forming a through-via over a carrier; encapsulating a device die and the through-via in an encapsulating material; forming a first dielectric layer over and contacting the device die, the through-via, and the encapsulating material; forming first via openings in the first dielectric layer to reveal the through-via and conductive features of the device die; plating first redistribution lines and an alignment mark, wherein the first redistribution lines comprise first via portions extending into the first via openings, and the alignment mark comprises a first plurality of elongated strips parallel to each other; forming a second dielectric layer over the first dielectric layer, with the alignment mark and first trace portions of the first redistribution lines embedded in the second dielectric layer; forming second via openings in the second dielectric layer to reveal the first redistribution lines, wherein the second via openings are formed using the alignment mark for alignment; and plating second redistribution lines comprising second via portions extending into the second via openings, and second trace portions over the second dielectric layer. In an embodiment, after the forming the second via openings, the alignment mark is covered by the second dielectric layer. In an embodiment, the method further includes forming a third dielectric layer over the second dielectric layer and the second redistribution lines; forming third via openings in the third dielectric layer to reveal the second redistribution lines, wherein the third via openings are formed using the alignment mark for alignment, and after the forming the third via openings, the alignment mark is overlapped by a portion of the third dielectric layer; and plating third redistribution lines comprising third via portions extending into the third via openings, and third trace portions over the third dielectric layer. In an embodiment, after the forming the second via openings, the alignment mark is revealed again, and in the plating the second redistribution lines, a seed layer used for plating the second redistribution lines is formed contacting the alignment mark, and the method further comprises etching portions of the seed layer in contact with the alignment mark. In an embodiment, the method further includes forming a third dielectric layer over the second dielectric layer and the second redistribution lines; forming third via openings in the third dielectric layer to reveal the second redistribution lines, wherein the third via openings are formed using the alignment mark for alignment, and in the forming the third via openings, a portion of the third dielectric layer directly over the alignment mark is removed, and a top surface of the second dielectric layer is exposed; and plating third redistribution lines comprises third via portions extending into the third via openings, and third trace portions over the third dielectric layer In an embodiment, the alignment mark further comprises a second plurality of elongated strips parallel to each other, and the first plurality of elongated strips and the second plurality of elongated strips are connected to form a ring. In an embodiment, the first plurality of elongated strips are separated from each other and have a substantially uniform width. In an embodiment, the first plurality of elongated strips are separated from each other and have a substantially uniform pitch.

In accordance with some embodiments of the present disclosure, a method of forming a semiconductor device includes plating an alignment mark over a first dielectric layer, wherein the alignment mark comprises a plurality of elongated strips parallel to each other, and the plurality of elongated strips have a substantially uniform pitch and a substantially uniform width; forming a plurality of redistribution lines over the first dielectric layer, wherein the plurality of redistribution lines are formed using the alignment mark for alignment; and sawing through the first dielectric layer and the alignment mark. In an embodiment, the forming the alignment mark comprises forming a seed layer over the first dielectric layer; forming a patterned mask over the seed layer, with portions of the seed layer exposed through the patterned mask; and plating the plurality of elongated strips of the alignment mark in the patterned mask. In an embodiment, the alignment mark has a void, with some middle portions of the plurality of elongated strips being removed. In an embodiment, the plurality of elongated strips comprise a first plurality of elongated strips having a first length, and a second plurality of elongated strips having a second length greater than the first length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a device die;
an encapsulating material, with the device die being in the encapsulating material;
a first dielectric layer over the device die and the encapsulating material;
a first plurality of redistribution lines extending into the first dielectric layer to electrically couple to the device die, wherein the first plurality of redistribution lines comprise via portions in the first dielectric layer and trace portions over the first dielectric layer;
an alignment mark over and contacting the first dielectric layer, wherein the alignment mark comprises a plurality of elongated strips;
a second dielectric layer over the first dielectric layer;
a second plurality of redistribution lines extending into the second dielectric layer to electrically couple to the first plurality of redistribution lines; and
an underfill comprising a portion contacting the second dielectric layer, wherein the portion of the underfill overlaps the alignment mark.

2. The package of claim 1, wherein the portion of the underfill is spaced apart from the alignment mark by the second dielectric layer.

3. The package of claim 1, wherein the underfill is in physical contact with the first dielectric layer, the second dielectric layer, and the alignment mark.

4. The package of claim 1, wherein the plurality of elongated strips in the alignment mark are parallel to and separated from each other, and the plurality of elongated strips are electrically floating.

5. The package of claim 1, wherein the plurality of elongated strips form a pattern having a void therein, and the plurality of elongated strips collectively surround the void.

6. The package of claim 1, wherein the plurality of elongated strips have a length-to-width ratio greater than about 5.

7. The package of claim 1, wherein the plurality of elongated strips in the alignment mark comprise first strips interconnected to form a first ring, with a first portion of the second dielectric layer being encircled by, and contacting, the first ring.

8. The package of claim 7, wherein the plurality of elongated strips in the alignment mark further comprise some strips interconnected to form a second ring encircling the first ring, with a second portion of the second dielectric layer being encircled by, and contacting, the second ring.

9. A package comprising:
a first package comprising:
   a through-via;
   a device die;
   an encapsulant encapsulating the device die and the through-via therein;
   a first dielectric layer over and contacting the device die, the through-via, and the encapsulant;
   an alignment mark over and contacting the first dielectric layer, wherein the alignment mark comprises a plurality of elongated strips parallel to each other, with the plurality of elongated strips being electrically floating;
   a second dielectric layer over and contacting the first dielectric layer; and
   a third dielectric layer over the second dielectric layer; and
an underfill in physical contact with a first sidewall of the third dielectric layer, wherein the underfill is further in contact with the second dielectric layer.

10. The package of claim 9 further comprising a second package bonding to the first package, wherein the underfill is between the first package and the second package, and wherein the first package comprises an edge, and wherein the alignment mark is adjacent to the edge.

11. The package of claim 9, wherein the underfill comprises a bottom portion contacting a top surface of the second dielectric layer to form a horizontal interface, and wherein the bottom portion overlaps the alignment mark, and the bottom portion is spaced apart from the alignment mark by the second dielectric layer.

12. The package of claim 9, wherein the underfill physically contacts the alignment mark and a second sidewall of the second dielectric layer.

13. The package of claim 9, wherein the plurality of elongated strips define a void therein, and wherein the plurality of elongated strips comprise:
   a first plurality of elongated strips, with the void cuts each of the first plurality of elongated strips into two pails; and
   a second plurality of elongated strips distributed on opposing sides of the void, with the second plurality of elongated strips being un-cut by the void.

14. The package of claim 9, wherein the plurality of elongated strips have a substantially uniform width.

15. The package of claim 9, wherein the plurality of elongated strips have a substantially uniform pitch.

16. A package comprising:
   a device die;
   an encapsulant encapsulating the device die therein;
   a first dielectric layer over and contacting the device die and the encapsulant;
   an alignment mark over and contacting the first dielectric layer, wherein the alignment mark comprises a plurality of elongated strips forming a pattern surrounding a void; and
   a second dielectric layer over the first dielectric layer, wherein the alignment mark is in the second dielectric layer, and wherein the second dielectric layer extends into the void.

17. The package of claim 16, wherein the plurality of elongate strips comprise strips forming a full ring.

18. The package of claim 16, wherein the plurality of elongate strips comprise:
   a first plurality of elongated strips, wherein the void separates each of the first plurality of elongate strips into two pails; and
   a second plurality of elongate strips, wherein the second plurality of elongate strips are distributed on opposing portions of the void, and are un-cut the void.

19. The package of claim 16, wherein the plurality of elongate strips are parallel to each other and have a uniform pitch.

20. The package of claim 16, wherein each of the plurality of elongated strips comprises a longer sidewall and a shorter sidewall, and the plurality of elongated strips comprise:
   a first plurality of elongated strips having the longer sidewalls facing the void; and
   a second plurality of elongated strips having the shorter sidewalls facing the void.

* * * * *

UNITED STATES PATENT AND TRADEMARK OFFICE
CERTIFICATE OF CORRECTION

PATENT NO. : 11,276,647 B2
APPLICATION NO. : 16/834103
DATED : March 15, 2022
INVENTOR(S) : Jhih-Yu Wang et al.

Page 1 of 1

It is certified that error appears in the above-identified patent and that said Letters Patent is hereby corrected as shown below:

In the Claims

Claim 13, Column 15, Line 39; delete "pails" and insert --parts--.

Claim 18, Column 16, Line 27; delete "pails" and insert --parts--.

Signed and Sealed this
Nineteenth Day of April, 2022

Katherine Kelly Vidal
*Director of the United States Patent and Trademark Office*